United States Patent
Bae et al.

(10) Patent No.: US 7,035,152 B1
(45) Date of Patent: Apr. 25, 2006

(54) SYSTEM AND METHOD FOR REDUNDANCY MEMORY DECODING

(75) Inventors: Myung Ho Bae, McKinney, TX (US); Jeff Koelling, Fairview, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/967,064

(22) Filed: Oct. 14, 2004

(51) Int. Cl.
*G11C 7/00* (2006.01)

(52) U.S. Cl. .............. 365/200; 365/225.7; 365/230.06; 365/195

(58) Field of Classification Search ................ 365/200, 365/230.06, 230.08, 225.7, 189.01, 230.01, 365/195
See application file for complete search history.

(56) References Cited

U.S. PATENT DOCUMENTS

| | | | |
|---|---|---|---|
| 4,885,720 A | 12/1989 | Miller et al. ................ 365/200 |
| 5,031,151 A | 7/1991 | Fifield et al. ............... 365/195 |
| 5,195,057 A | 3/1993 | Kasa et al. ................. 365/200 |
| 5,270,975 A | 12/1993 | McAdams .................. 365/200 |
| 5,270,976 A | 12/1993 | Tran .......................... 365/200 |
| 5,327,380 A | 7/1994 | Kersh, III et al. .......... 365/195 |
| 5,544,106 A * | 8/1996 | Koike ........................ 365/200 |
| 5,568,061 A | 10/1996 | McClure ..................... 326/13 |
| 5,572,471 A | 11/1996 | Proebsting .................. 365/200 |
| 5,574,689 A | 11/1996 | Morgan ...................... 365/200 |
| 5,612,918 A | 3/1997 | McClure .................... 365/200 |
| 5,627,786 A | 5/1997 | Roohparvar ................ 365/200 |
| 5,673,227 A | 9/1997 | Engles et al. .............. 365/200 |
| 5,841,712 A | 11/1998 | Wendell et al. ............ 365/200 |
| 5,848,006 A | 12/1998 | Nagata .................. 365/230.06 |
| 5,867,433 A | 2/1999 | Shen et al. ................. 365/200 |
| 5,873,122 A | 2/1999 | Nishii et al. .................. 711/5 |
| 5,889,710 A * | 3/1999 | Pascucci .................... 365/200 |
| 6,018,482 A | 1/2000 | Fujita ........................ 365/200 |
| 6,067,260 A | 5/2000 | Ooishi et al. .............. 365/200 |
| 6,137,735 A | 10/2000 | Wei et al. .................. 365/200 |
| 6,201,745 B1 | 3/2001 | Ryu et al. .................. 365/200 |
| 6,219,285 B1 | 4/2001 | Murakuki et al. .......... 365/200 |
| 6,246,623 B1 | 6/2001 | Ingalls .................... 365/225.7 |
| 6,249,466 B1 * | 6/2001 | Ramakrishnan ............ 365/200 |
| 6,262,935 B1 | 7/2001 | Parris et al. ........... 365/230.06 |
| 6,281,739 B1 | 8/2001 | Matsui ....................... 327/525 |
| 6,320,799 B1 | 11/2001 | Miyazaki et al. .......... 365/200 |
| 6,324,105 B1 | 11/2001 | Shirley ....................... 365/200 |
| 6,349,064 B1 | 2/2002 | Nakaoka .................... 365/200 |
| 6,373,775 B1 | 4/2002 | Ishikawa ................ 365/230.03 |
| 6,424,584 B1 | 7/2002 | Seyyedy ................... 365/225.7 |
| 6,438,046 B1 | 8/2002 | Agrawal .................... 365/200 |
| 6,571,348 B1 | 5/2003 | Tsai et al. ...................... 714/6 |
| 6,668,345 B1 | 12/2003 | Ooishi et al. ............... 714/710 |
| 6,707,730 B1 | 3/2004 | Mori et al. ................ 365/200 |
| 6,707,734 B1 | 3/2004 | Demone .................... 365/200 |
| 6,732,229 B1 | 5/2004 | Leung et al. .............. 711/109 |
| 2003/0151437 A1 | 8/2003 | Demone .................... 327/218 |
| 2004/0019763 A1 | 1/2004 | Lakhani et al. ............ 711/206 |
| 2004/0141384 A1 | 7/2004 | Keeth et al. ............... 365/200 |

* cited by examiner

*Primary Examiner*—Gene N. Auduong
(74) *Attorney, Agent, or Firm*—Dorsey & Whitney LLP

(57) ABSTRACT

A redundancy system for disabling access to normal memory elements when memory addresses corresponding to those normal memory elements match programmed redundancy addresses before the memory addresses and the programmed redundancy addresses are compared. Access to the normal memory elements is disabled based on the programmed redundancy addresses.

69 Claims, 9 Drawing Sheets

PLACED 64 TIMES

| F45<i> | F23<i> | F01<i> | FDEC<i> | F45<i> | F23<i> | F01<i> | FDEC<i> |
|---|---|---|---|---|---|---|---|
| <0> | <0> | <0> | <0> | <2> | <0> | <0> | <32> |
| <0> | <0> | <1> | <1> | <2> | <0> | <1> | <33> |
| <0> | <0> | <2> | <2> | <2> | <0> | <2> | <34> |
| <0> | <0> | <3> | <3> | <2> | <0> | <3> | <35> |
| <0> | <1> | <0> | <4> | <2> | <1> | <0> | <36> |
| <0> | <1> | <1> | <5> | <2> | <1> | <1> | <37> |
| <0> | <1> | <2> | <6> | <2> | <1> | <2> | <38> |
| <0> | <1> | <3> | <7> | <2> | <1> | <3> | <39> |
| <0> | <2> | <0> | <8> | <2> | <2> | <0> | <40> |
| <0> | <2> | <1> | <9> | <2> | <2> | <1> | <41> |
| <0> | <2> | <2> | <10> | <2> | <2> | <2> | <42> |
| <0> | <2> | <3> | <11> | <2> | <2> | <3> | <43> |
| <0> | <3> | <0> | <12> | <2> | <3> | <0> | <44> |
| <0> | <3> | <1> | <13> | <2> | <3> | <1> | <45> |
| <0> | <3> | <2> | <14> | <2> | <3> | <2> | <46> |
| <0> | <3> | <3> | <15> | <2> | <3> | <3> | <47> |
| <1> | <0> | <0> | <16> | <3> | <0> | <0> | <48> |
| <1> | <0> | <1> | <17> | <3> | <0> | <1> | <49> |
| <1> | <0> | <2> | <18> | <3> | <0> | <2> | <50> |
| <1> | <0> | <3> | <19> | <3> | <0> | <3> | <51> |
| <1> | <1> | <0> | <20> | <3> | <1> | <0> | <52> |
| <1> | <1> | <1> | <21> | <3> | <1> | <1> | <53> |
| <1> | <1> | <2> | <22> | <3> | <1> | <2> | <54> |
| <1> | <1> | <3> | <23> | <3> | <1> | <3> | <55> |
| <1> | <2> | <0> | <24> | <3> | <2> | <0> | <56> |
| <1> | <2> | <1> | <25> | <3> | <2> | <1> | <57> |
| <1> | <2> | <2> | <26> | <3> | <2> | <2> | <58> |
| <1> | <2> | <3> | <27> | <3> | <2> | <3> | <59> |
| <1> | <3> | <0> | <28> | <3> | <3> | <0> | <60> |
| <1> | <3> | <1> | <29> | <3> | <3> | <1> | <61> |
| <1> | <3> | <2> | <30> | <3> | <3> | <2> | <62> |
| <1> | <3> | <3> | <31> | <3> | <3> | <3> | <63> |

# SYSTEM AND METHOD FOR REDUNDANCY MEMORY DECODING

TECHNICAL FIELD

This invention relates generally to redundancy memory for a memory, and more particularly, to a memory having a redundancy system employing a programmable static redundancy memory element decode path.

BACKGROUND OF THE INVENTION

Typical integrated memory devices include arrays of memory cells arranged in rows and columns. In many such memory devices, several redundant rows and columns are provided to replace malfunctioning memory cells found during testing. Testing is typically performed by having predetermined data values written to selected row and column addresses that correspond to memory cells. The memory cells are then read to determine if the data read matches the data written to those memory cells. If the read data does not match the written data, then those memory cells are likely to contain defects which will prevent proper operation of the memory device.

The defective memory cells may be replaced by enabling the redundant circuitry. A malfunctioning memory cell in a column or a row is substituted with a corresponding redundant element, such as an entire column or row of redundant memory cells, respectively. Therefore, a memory device need not be discarded even though it contains defective memory cells. Substitution of one of the redundant rows or columns is accomplished in a memory device by programming a specific combination of fuses, or if the memory device uses antifuses, by programming a specific combination of antifuses, located in one of several fuse or antifuse circuits in the memory device. Conventional fuses are resistive devices which may be opened or broken with a laser beam or an electric current. Antifuses are capacitive devices that may be closed or blown by breaking down a dielectric layer in the antifuse with a relatively high voltage. A set of fuses or antifuses is associated with each redundant element, and is programmed, or "blown," according to the address of the defective element the redundant element will replace. The programmed addresses for the defective memory locations that are mapped to a redundant element are static, that is, once programmed, the address of the defective memory locations are known well before a row or a column of memory of the memory is ever accessed.

When a row or column address received by the memory device matches one of the programmed addresses, the redundant element associated with the matching address is accessed instead of the row or column having the defective memory cells. In determining whether an address the memory device receives matches one of the programmed addresses, each incoming address is compared to the addresses programmed in the fuse or antifuse circuits. If a match is detected, then the corresponding redundant row or column is accessed, and the defective row or column is ignored, thus, remapping the memory address to the redundant element.

FIG. 1 is a block diagram for a conventional redundancy system 100 that can be used for row redundancy elements or for column redundancy elements, as previously described. As shown in FIG. 1, there are "n" normal memory elements and "m" redundant elements. Memory addresses are provided to an address predecoder 104 and to m comparators 108(1)–108(m). Each of the comparators 108(1)–108(m) further receives a respective redundancy address against which the memory addresses are compared. Redundancy addresses are provided by a respective antifuse circuit (not shown) in which the memory address for a defective memory is programmed.

In operation, memory addresses corresponding to memory locations for memory access operations are provided to the memory device. The address predecoder 104 generates internal predecoded address signals AXY<i>, "i" representing an integer value corresponding to the number of internal predecoded address signals are generated, that are provided to n decoders 120(1)–120(n) through a delay 110. As will be explained in more detail below, the delay 110 provides sufficient delay to the AXY<i> signals to allow for the decoders 120(1)–120(m) to be disabled when the memory address does match one of the programmed addresses provided to one of the comparators 108(1)–108 (m). In response to the AXY<i> signals, one of the decoders 120(1)–120(n) generates an active decode signal DEC(1)–DEC(n) to enable a respective driver 130(1)–130(n) to generate a respective selection signal CSELn activating one of the n normal elements to be accessed. As previously discussed, the memory address is also compared by the comparators 108(1)–108(m) to the respective redundancy addresses. If a memory address received by the memory device does not match any of the redundancy addresses provided to the comparators 108(1)–108(m), none of the comparators will generate an active redundancy match signal RED.

In contrast, if a memory address matches one of the programmed redundancy addresses provided to the comparators 108(1)–108(m), the comparator that determines the match generates an active REDm signal. The RED(1)–RED(m) signals, including the active REDm signal, are provided to a respective redundancy decoder 124(1)–124(m) through a respective delay 112(1)–112(m). The delays 112(1)–112(m) are generally the same as the delay 110 in terms of delay time. The redundancy decoders 124(1)–124(m) included in the signal path to match the propagation delay of the decoders 120(1)–120(n). The redundancy decoder 124(1)–124(m) that receives the active RED(1)–RED(m) signal generates an active redundancy enable signal RENABLEm to enable a respective redundancy driver 134(1)–134(m). In turn, the redundancy driver 134(1)–134(m) that is enabled generates a redundancy selection signal RCSELm to activate the respective redundant element.

While one of the comparators generates an active REDm signal to activate the respective redundant element, the address predecoder 104 is also going through the process of generating AXY<i> signals to access the normal memory element corresponding to the memory address. In order to prevent the decoder 120(1)–120(n) corresponding to the memory address from activating the respective driver 130(1)–130(n), and the redundancy decoder 124(1)–124(m) corresponding to the comparator 108(1)–108(m) determining the matching address from activating the respective redundancy driver 134(1)–134(m) at the same time, the logic circuit 116 generates an active decoder disable signal DISABLE in response to any one of the RED(1)–RED(m) signals being active. The DISABLE signal is provided to all of the decoders 120(1)–120(n) to prevent any of the decoders from activating the respective driver. The delay 110 adds sufficient delay time to the propagation of the AXY<i> signals to accommodate the propagation delay through the comparators 108(1)–108(m) and the logic circuit 116. Thus, the decoders 120(1)–120(n) will be disabled by the active DISABLE signal before the AXY<i> signals reach the decoders 120(1)–120(n).

FIG. 2 is a timing diagram of various signals during the operation of the redundancy system 100 of FIG. 1. At a time T1, the memory address transitions indicating a new memory address has been provided to the address predecoder 104 and the comparators 108(1)–108(m). At a time T2, a predecode propagation delay tPRE after the time T1, the address predecoder 104 generates the AXY<i> signals and the comparators 108(1)–108(m) generate the RED(1)–RED(m) signals. At a time T3, dAXY<i> signals and dRED(1)–dRED(m) signals are output by the delay 110 and the delays 112(1)–112(m) in response to the AXY<i> signals and RED(1)–RED(m) signals, all respectively. As previously discussed, the delays 110 and 112(1)–112(m) are provided to accommodate the propagation delay tDIS for generating an active DISABLE signal if a redundancy element is being accessed instead of the normal element. Without the delays 110 and 112(1)–112(m), the AXY<i> signals and the RED(1)–RED(m) signals would be provided to the decoders 120(1)–120(n) and the 124(1)–124(m) before the DISABLE signal could be provided to disable the decoders 120(1)–120(n) in the event a redundancy element is being accessed. Thus, the time between T2 and T3 is roughly equal to the propagation delay time tDIS, which can be approximately equal to or greater than the propagation delay of the logic circuit 116 to ensure that the decoders 120(1)–120(n) are disabled before they can be activated if a redundancy element is to be accessed.

As shown in FIG. 2, at a time T4, which is a decoder propagation delay tDEC after the time T3, the dAXY<i> signals have been provided to the decoders 120(1)–120(n), and one of the decoders 120(1)–120(n) will generate an active DEC(1)–DEC(n) signal to enable one of the drivers 130(1)–130(n), unless an active DISABLE has been provided to disable the decoders 120(1)–120(n). Similarly, if an address match is detected by one of the comparators 108(1)–108(m), at the time T4 the dRED(1)–dRED(m) signals have been provided to the redundancy decoder 124(1)–124(m) corresponding to the comparator 108(1)–108(m) detecting the matching addresses and that redundancy decoder 124(1)–124(m) is ready to generate an active RENABLEm signal. Finally at a time T5, a driver propagation delay tDRV after the time T4, the select signal CSEL(1)–CSEL(n) (to access a normal element) or RCSEL(1)–RCSEL(m) (to access a redundant element rather than the defective normal element) is generated to activate one of the normal or redundant elements. As shown in the timing diagram of FIG. 2, and as previously described, the delay time tD is added in the conventional redundancy system 100 regardless of whether a redundant element is accessed or a normal element is accessed. The tD of the conventional redundancy system 100 directly affects the access time of a memory device, that is, the time for data to be read from a memory device. Consequently, avoiding the delay time tD to improve access time for the memory devices is desirable.

One approach that has been developed to avoid the tD of the conventional redundancy system 100 is to include dedicated disable logic for each row or column of normal memory. The disable logic can be programmed through the use of antifuses at the same time redundancy addresses are being programmed into the antifuse circuits for the redundant elements. Defective rows or columns of memory can be disabled by programming the disable logic dedicated for that row or column of memory. As a result, when the memory device receives a memory address corresponding to one of the defective rows or columns of memory, there is no need to wait for signals to propagate through a comparator or a logic circuit to disable access to the defective row or column since the dedicated disable logic has already disabled the defective row or column. Although including the dedicated disable logic eliminates the need to include a delay time tD in the signal paths to access normal and redundant elements, having dedicated disable logic for each row or column of memory in a memory device consumes a considerable amount of space on the semiconductor die of the memory device. Additionally, the use of antifuses or fuses to program the dedicated disable logic further exacerbates the problem since the physical dimensions of the antifuses and fuses also require considerable space on the die. Thus, the use of dedicated disable logic for the rows or columns of memory is not practical.

Another redundancy system that has been developed to reduce or eliminate the delay time tD utilizes redundant elements physically located at the periphery of a redundancy domain that are utilized by "shifting" the decoding of memory addresses "up" or "down" to avoid defective memory elements. A redundancy domain includes a limited number of redundancy elements allocated for the defective memory of a region of memory. For example, with respect to column redundancy, when a defective column of memory is identified, the defective column is ignored by shifting all of the column addresses over by one column, and utilizing a column of redundant memory at the periphery. Thus, the address of the defective column is now remapped to an adjacent column of memory. Shortcomings of this redundancy system include sacrificing considerable space on the die of the memory device to include the logic circuits necessary to remap the shifted memory addresses. Additionally, this redundancy system lacks flexibility because the allocation of redundant elements for each redundancy domain is limited by the complexity of the supporting logic. Moreover, there is potential access time penalties caused by the propagation delay of signals through the supporting logic.

Therefore, there is a need for an alternative redundancy system that reduces or eliminates the forced delay of conventional redundancy systems and that can be practically implemented.

SUMMARY OF THE INVENTION

One aspect of the invention provides a redundancy system for disabling access to normal memory elements when memory addresses corresponding to those normal memory elements match programmed redundancy addresses before the memory addresses and the programmed redundancy addresses are compared. The redundancy system includes a first plurality of decoder circuits configured to select a memory element for an access operation according to address signals and further includes a plurality of redundancy circuits. Each of the redundancy circuits has a set of programmable elements for programming a redundancy address corresponding to a memory element selected by one of the first plurality of decoder circuits. A second plurality of decoder circuits are coupled to the plurality of redundancy circuits and are configured to select a redundancy element for the access operation in response to receiving address signals matching one of the redundancy addresses programmed in the redundancy circuits. A decoder disable circuit is coupled to the first and second pluralities of decoder circuits and are further coupled to the plurality of redundancy circuits. Based on the redundancy addresses programmed in the redundancy circuits, the decoder disable circuit selectively and concurrently disables the decoder circuits of the first plurality that select the memory elements corresponding to the redundancy addresses programmed in the redundancy circuits.

DETAILED DESCRIPTION OF PREFERRED EMBODIMENTS

Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
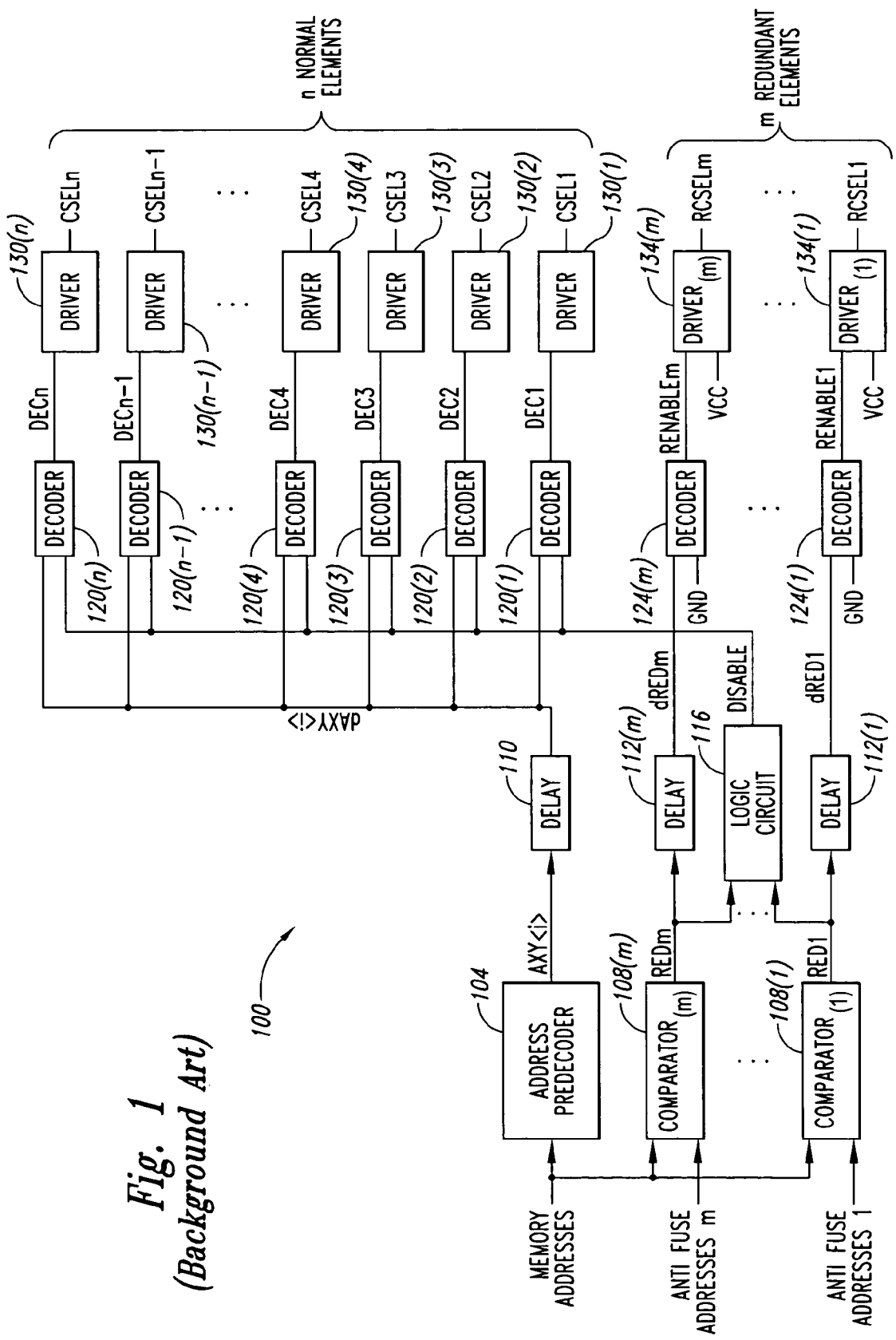
FIG. 1 is a functional block diagram of a conventional redundancy system.
Figure 3:
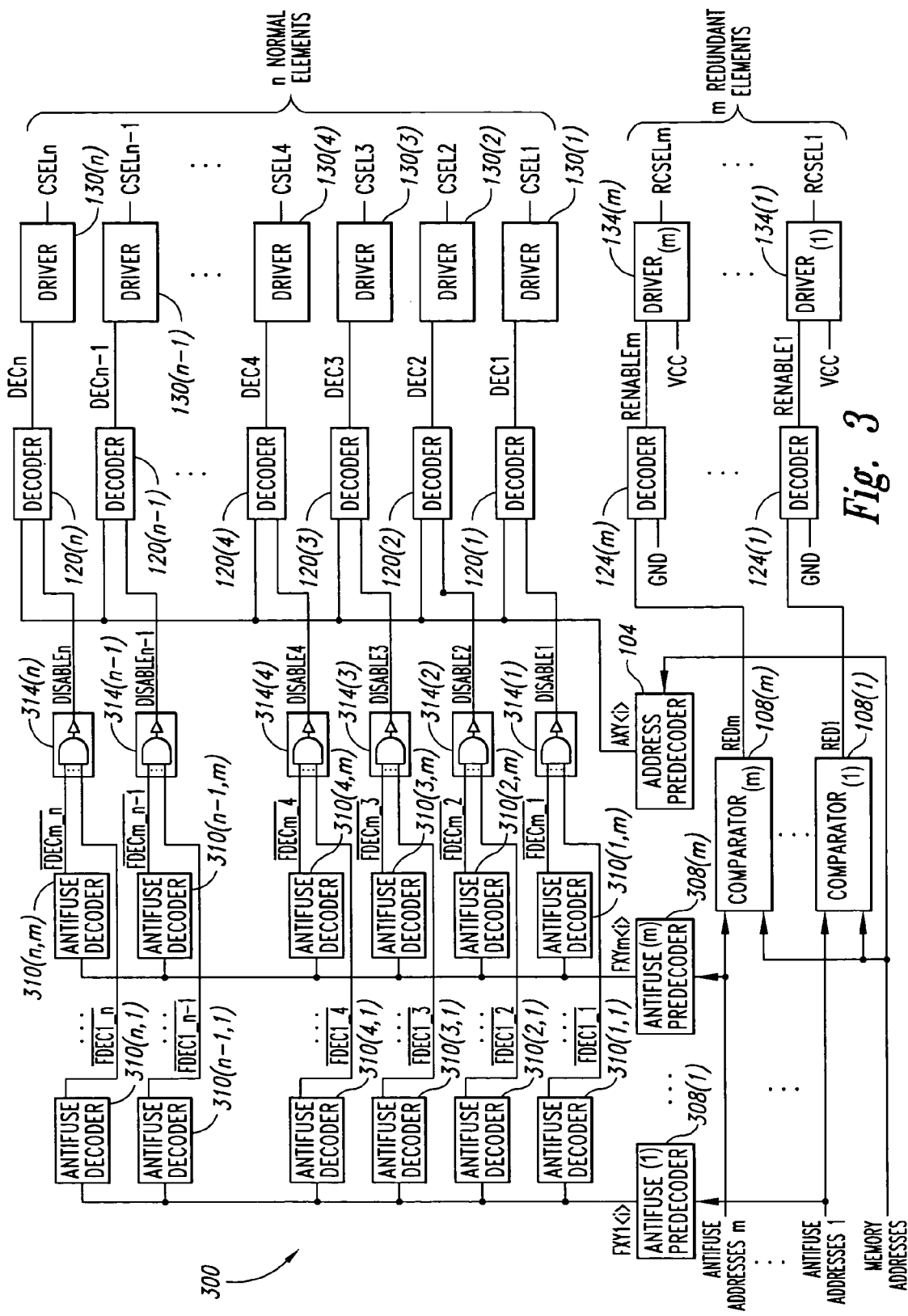
FIG. 3 is a functional block diagram of a redundancy system according to an embodiment of the present invention.

FIG. 3 illustrates a redundancy system 300 according to an embodiment of the present invention. Functional blocks included in the redundancy system 300 that have been previously described with respect to the redundancy system 100 of FIG. 1 have been identified using the same reference numbers. For example, the redundancy system 300 includes an address decoder 104, comparators 108(1)–108(m), decoders 120(1)–120(n) and redundancy decoders 124(1)–124(m), and drivers 130(1)–130(n) and redundancy drivers 134(1)–134(m). Operation of these elements are the same as previously described. The redundancy system 300 further includes a plurality of antifuse decoders 310(1,1)–310(n,m). As shown in FIG. 3, the plurality of antifuse decoders 310 are arranged in rows (1 to n) corresponding to a respective decoder and driver pair (1 to n), and further arranged in columns (1 to m) corresponding to a respective antifuse predecoder (1 to m). In FIG. 3, the antifuse decoders 310 are identified according to their row and column as 310 (row, column). Disable logic 314(1)–314(n) is also included in the redundancy system 300. Each of the disable logic 314 is coupled to the antifuse decoders 310 of a respective row (1 to n), and provides an active disable signal DISABLE(1)–DISABLE(n) to a respective one of the decoders 120(1)–120(n). As shown in FIG. 3, NAND gates are used for the disable logic 314(1)–314(n), however, other logic circuits can be used as well.

The redundancy system 300 will now be described with respect to column redundancy, although embodiments of the present invention can be applied to row redundancy as well. Moreover, the redundancy system 300 will be described as using antifuses, however fuses can also be used as well. In operation, redundancy addresses are provided by a respective antifuse circuit (not shown) in which the address for a defective column of memory is programmed, as previously described with respect to the redundancy system 100 of FIG. 1. The redundancy addresses are static and are applied to the comparators 108(1)–(m) and the antifuse predecoders 308(1)–308(m) prior to any access operation to the normal memory elements. That is, the redundancy addresses corresponding to defective columns of memory are already programmed in the antifuse circuits and the comparators 108(1)–(m) and the antifuse predecoders 308(1)–308(m) can receive the redundancy addresses well before column memory addresses for a column access operation are provided to the address predecoder 104 and the comparators 108(1)–108(m) for an access operation.

Each of the antifuse predecoders 308(1)_308(m) that receives an redundancy address generates antifuse predecode signals FXYm<i> corresponding to the respective redundancy address. The "m" corresponds to which antifuse decoder 308(1)–308(m) generates the signals, and the "i" is an integer value representing the number of signals in the antifuse predecode signal. The value of <i> is related to the number of columns of memory that can be required by the redundancy column memory, and should be a sufficient number to allow selection of one of the n normal columns of memory at a time. The FXYm<i> signals are provided to the antifuse decoders 310 to which a respective antifuse predecoder 308(1)–308(m) is coupled. As shown in FIG. 3, each antifuse predecoder 308(1)–308(m) is coupled to a respective column of antifuse decoders 310 (1 to n). Based on the FXYm<i> signals that are generated, one of the antifuse decoders 310 (1 to n) in a column will generate an antifuse decode signal FDECm_n. The FDECm_n signal for the one antifuse decoder 310 (1 to n) will be applied to the respective disable logic 314 (1 to n). As a result, the respective disable logic 314 (1 to n) will generate an active DISABLEn signal to disable the corresponding decoder 120(1)–120(n). As previously discussed, since the redundancy addresses for the defective columns of memory are static, and consequently, are available before a column access operation begins, the decoders 120(1)–120(n) corresponding to the defective columns of memory can also be disabled before the column access operation begins. As a result, the redundancy system 300 does not include delays in the redundancy decode signal path to prevent selecting both the defective normal memory element and the redundant element to which the memory address is mapped, in contrast to the redundancy system 100 of FIG. 1. Thus, by the time a memory address for a column access operation is received, and the memory address matches the address of a defective column of memory that is programmed in an antifuse circuit, the decoder 120(1)–120(n) for the defective column of memory can already be disabled. The comparator 108(1)–108(m) coupled to the antifuse circuit programmed with the address of the defective column of memory responds to receiving the matching memory address by generating an active redundancy match signal RED(m) to activate the corresponding redundancy driver 124(1)–124(m) and the redundancy driver 134(1)–134(m). As a result, a redundancy column select signal RCSEL is generated by the redundancy driver 134(1)–134(m) to select the column of redundancy memory to which the memory address has been mapped. Although not necessary for the operation of the redundancy system 300, the redundancy drivers 124(1)–124(m) are provided to match the signal propagation delay added by the decoders 120(1)–120(n) coupled to the drivers 130(1)–130(n). In an alternative embodiment, the redundancy drivers 124(1)–124(m) are omitted and the comparators 108(1)–108(m) activate a respective one of the redundancy drivers 134(1)–134(m) to access the redundant memory element.

For example, a first redundancy address corresponding to a first defective column of memory is provided to the antifuse predecoder 308(1). In the present example, it will be assumed that column of memory driven by the column select signal CSEL4 is defective, and the address has been remapped to the column of redundant memory driven by the redundancy column select signal RCSEL1. That is, the redundancy address programmed in the antifuse circuit coupled to the antifuse decoder 308(1) and the comparator 108(1) corresponds to the column driven by the CSEL4 signal. The antifuse predecoder 308(1) generates FXY1<i> signals corresponding to the redundancy address, and in response to the FXY1<i> signals, the antifuse decoder 310(4,1) generates an active FDEC1_4 signal. The FDEC1_4 signal causes the disable logic 314(4) to generate a DISABLE4 signal to disable the decoder 120(4). In this manner, the defective column of memory driven by the CSEL4 signal cannot be accessed.

Upon receiving a memory address corresponding to the defective column of memory driven by the CSEL4 signal, the comparator 108(1) generates an active RED1 signal. In response, the decoder 124(1) generates an active redundancy enable signal RENABLE1 to enable the redundancy driver 134(1). The redundancy driver 134(1) generates an active RCSEL1 signal to drive the column of redundancy memory driven by the RCSEL1 signal to be accessed in stead of the defective column of memory driven by the CSEL4 signal.

The address predecoder 104 also receives the memory address corresponding to the column of memory driven by the CSEL4 signal at the same time it is received by the comparator 108(1). Concurrently with the redundancy decoding process of the comparator 108(1) and the decoder 124(1), the address predecoder 104 generates AXY<i> signals to activate the decoder 120(4). However, the decoder 120(4) does not respond to the AXY<i> signals because the decoder 120(4) has already been disabled by the DISABLE4 signal of the disable logic 314(4), as previously discussed. As illustrated by the present example, the defective column of memory driven by the CSEL4 signal can be disabled without the need to add any delay time during the redundancy decoding process.

Figure 4:
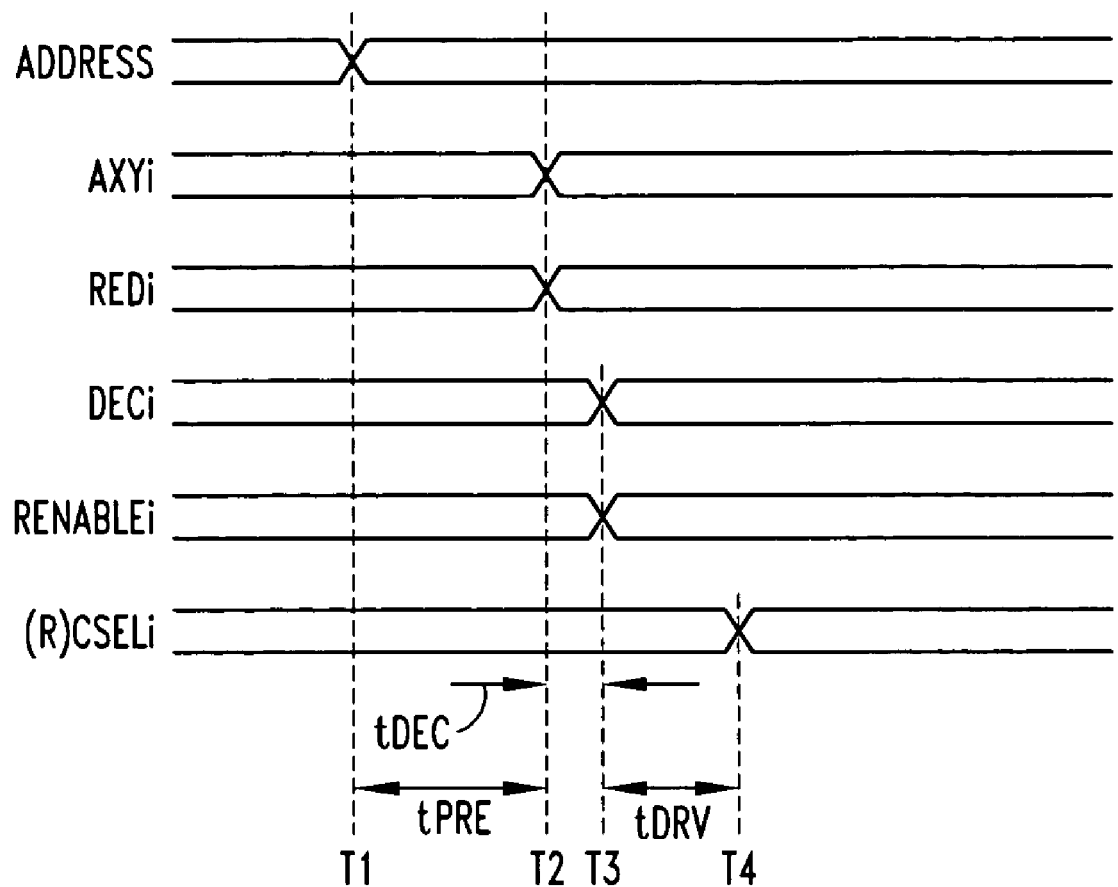
FIG. 4 is a timing diagram of various signals during the operation of the redundancy system of FIG. 3.

FIG. 4 illustrates the timing of various signals during the operation of the redundancy system 300. The signals of FIG. 4 will be described with respect to the present example of remapping the address of the column of memory driven by the CSEL4 signal to the redundancy memory driven by the RCSEL1 signal. At a time T1, the memory address corresponding to the column of memory driven by the CSEL4 signal is received by all of the comparators 108(1)–108(m), as well as the address predecoder 104. At a time T2, a comparator/address predecode propagation delay time tPRE after the time T1, the comparator 108(1), which as previously discussed corresponds to the column of redundant memory to which the column driven by the CSEL4 signal has been remapped, generates an active RED1 signal. The address predecoder 104 similarly generates AXY<i> signals to activate the decoder 120(4) at the time T2. At a time T3, a decoder propagation delay time tDEC, the redundancy decoder 124(1) generates an active RENABLE1 signal to enable the redundancy driver 134(1). As previously discussed, the decoder 120(4) does not generate an active DEC4 signal because it has already been disabled by the active DISABLE4 signal from the disable logic 314(4). At a time T4, a driver propagation delay time tDRV after the time T3, the redundancy driver 134(1) generates an active RCSEL1 signal to activate the column of redundant memory to which the address corresponding to the CSEL4 signal has been remapped.

Figure 2:
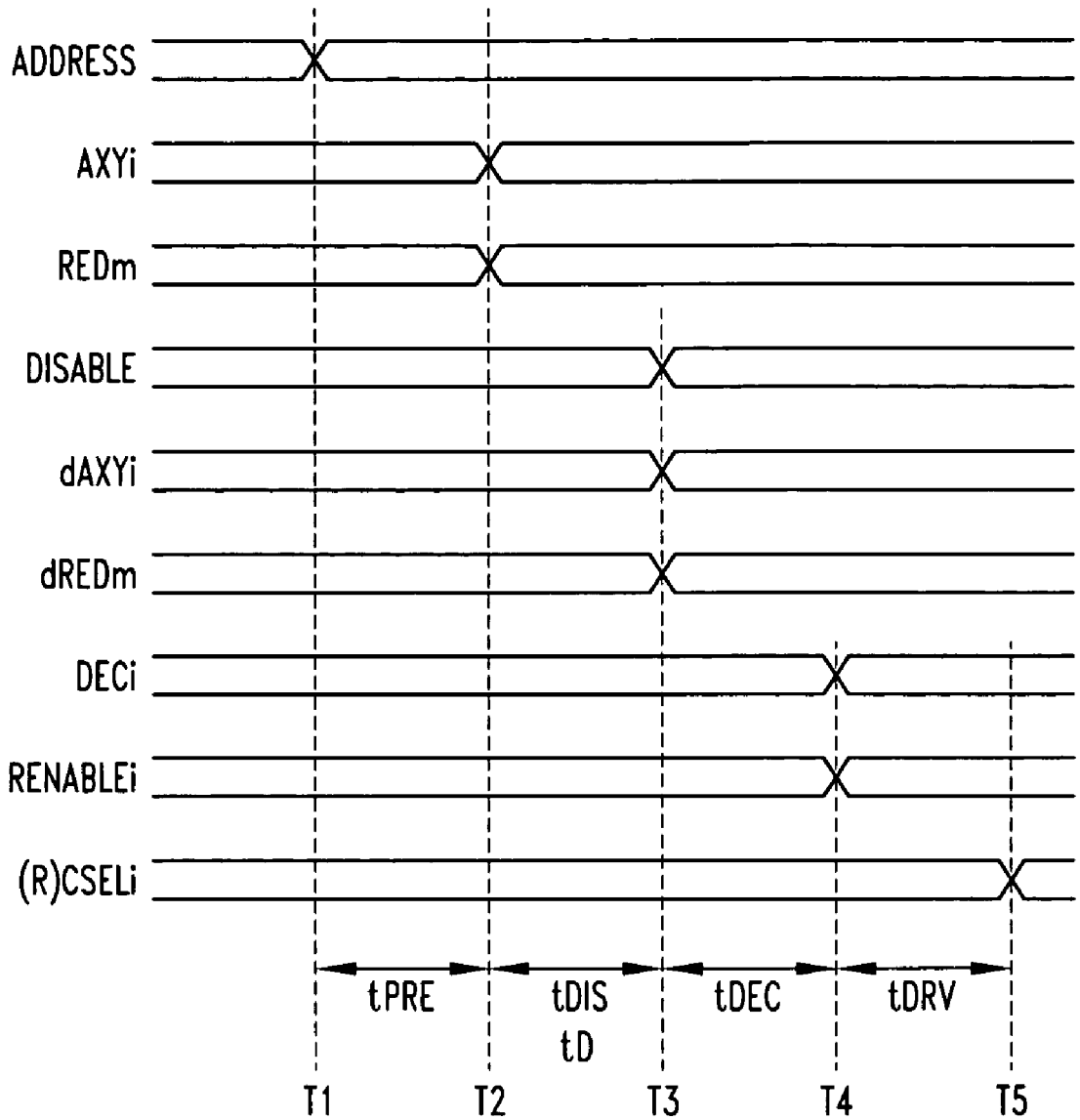
FIG. 2 is a timing diagram of various signals during the operation of the convention redundancy system of FIG. 1.

The DECi signal is shown in FIG. 4 making a transition at the time T3 for the purpose of comparing the timing with the ENABLEi signal. That is, the DECi signal is shown in FIG. 4 as being generated after only a tDEC delay from when the decoder receives the AXY<I> signals. As further shown in FIG. 4, the RENABLEi signal is also generated with only a tDEC delay. In contrast to the timing diagram of FIG. 2, that is, the timing diagram for the redundancy system 100 of FIG. 1, active DECi and RENABLEi signals can be generated tDEC after the address predecoder 104 and the comparators 108(1)–108(m) receive a memory address, rather than having to wait an additional forced delay time tD. Thus, with embodiments of the present invention, one such embodiment shown in FIG. 3, the forced delay time tD can be eliminated from the address decode process for each memory access operation.

Figure 5:
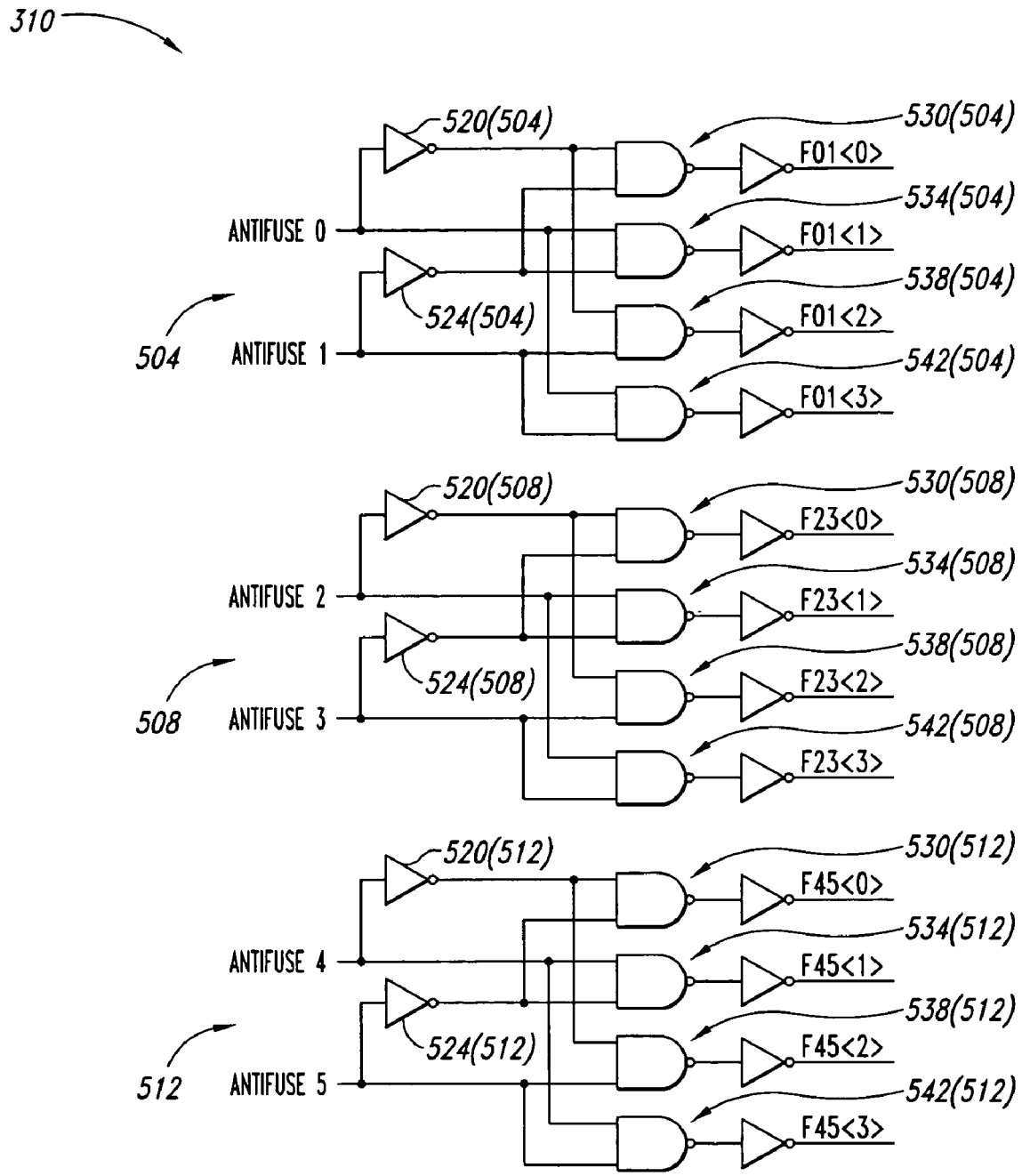
FIG. 5 is a schematic drawing of an antifuse predecoder for a redundancy system according to an embodiment of the present invention.

FIG. 5 illustrates the antifuse predecoder 308 according to an embodiment of the present invention. The antifuse predecoder 308 is shown in FIG. 5 for a 6-bit redundancy address. The antifuse predecoder 308 includes three sets of predecoder stages 504, 508, 512. The predecoder stages 504, 508, 512 are the same except that the pair of input redundancy address signals ANTIFUSEn each predecoder stage receives is different. The predecoder stage 504 receives input redundancy address signals ANTIFUSE0 and ANTIFUSE1, the predecoder stage 508 receives input redundancy address signals ANTIFUSE2 and ANTIFUSE3, and the predecoder stage 512 receives input redundancy address signals ANTIFUSE4 and ANTIFUSE5. Operation of the predecoder stages 504, 508, 512 are the same, and consequently, operation will only be described with respect to the predecoder stage 504 in the interest of brevity. The predecoder stage 504 includes two input inverters 520 and 524. Four two-input AND gates 530, 534, 538, 542 are coupled to four combinations of the ANTIFUSE0 signal, the ANTIFUSE1 signal, and the complementary signals. The AND gates 530, 534, 538, 542 output a first group of four antifuse predecode signals based on the combination of the ANTIFUSE0 and ANTIFUSE1 signals, and the complementary signals. One of the four antifuse predecode signals will be active based on the states of the ANTIFUSE0 and ANTIFUSE1 signals. In combination with the antifuse predecode signals output by the predecode stages 508 and 512, each antifuse predecoder 308 can generate a 12-bit antifuse decode signal FXYm<i>.

Figure 6:
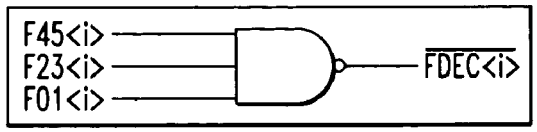
FIG. 6 is a schematic drawing of a redundant decoder for a redundancy system according to an embodiment of the present invention.

FIG. 6 illustrates the antifuse decoder 310 according to an embodiment of the present invention. As shown in FIG. 6, a three-input NAND gate is used as the antifuse decoder 310. The output of the antifuse decoder 310 is coupled to the one of the inputs of a respective disable logic 314 to provide an antifuse decode signal FDECm_n. The antifuse predecoder 308 illustrated in FIG. 5 can be used with the antifuse decoder 310 to select one of sixty-four antifuse decoders 310 to generate an active FDECm_n signal. That is, 64 antifuse decoders 310 can be coupled to each antifuse predecoder 308 and one of the 64 antifuse decoders 310 can be selected using the 6-bit redundancy address. A table in FIG. 6 shows which one of 64 antifuse decoders 310 coupled to the antifuse predecoder 308 will be selected to generate an active FDECm_n signal based on the FXYm<i> signals.

Figure 7:
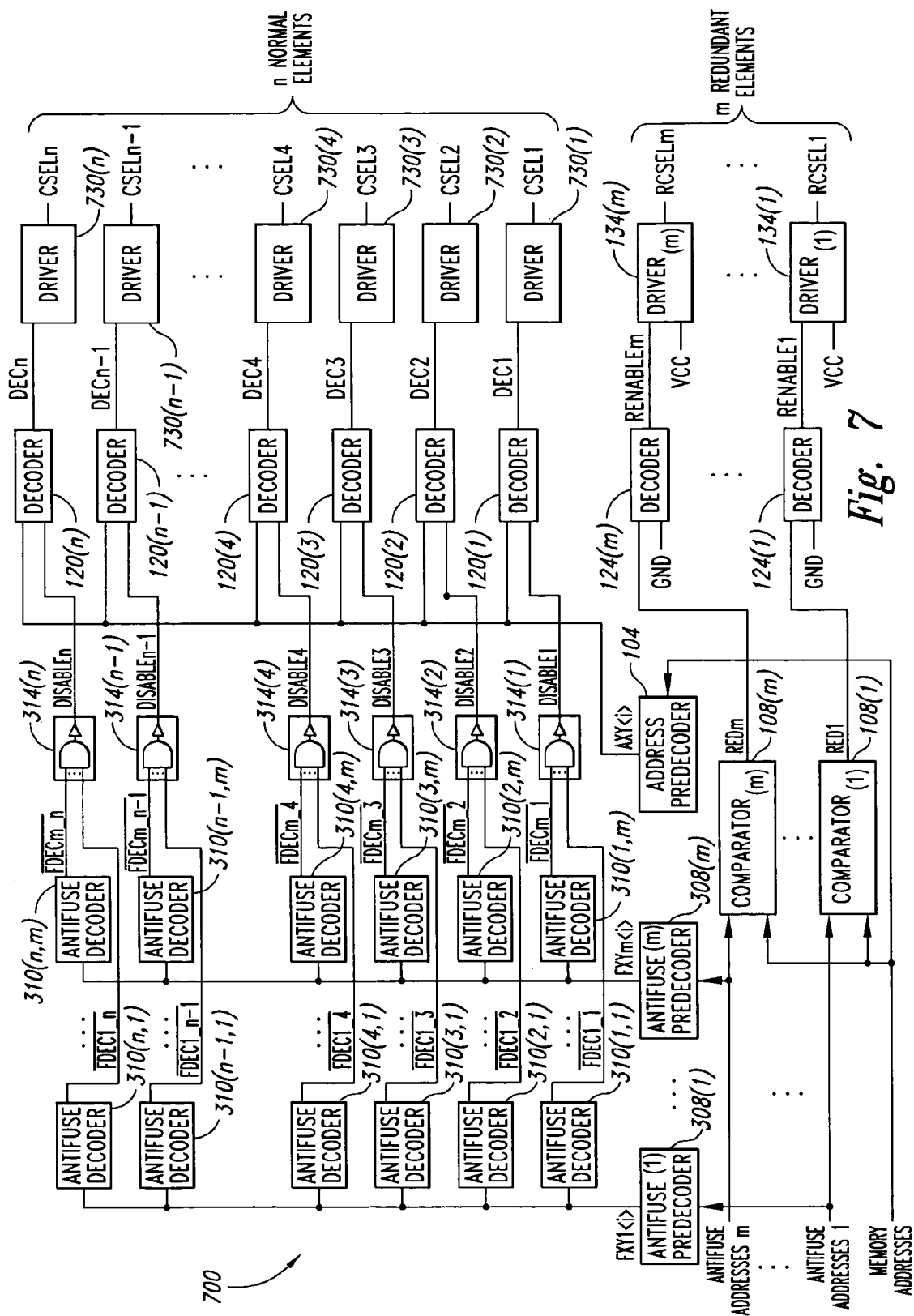
FIG. 7 is a functional block diagram of a redundancy system according to an alternative embodiment of the present invention.

FIG. 7 illustrates a redundancy system 700 according to an alternative embodiment of the present invention. The redundancy system 700 includes functional blocks previously described with respect to FIGS. 1 and 3. Such functional blocks will be identified using the previously defined reference numbers. In the redundancy system 700, the disable signals DISABLEn generated by the disable logic 314(1)–314(n) are provided to respective drivers 730(1)–730(n), rather than to the decoders 120(1)–120(n) as previously described with respect to the redundancy system 300 of FIG. 3. The drivers 730(1)–730(n) can be designed using conventional circuits by those ordinarily skilled in the art based on the description provided herein. The operation of the redundancy system 700 is similar to the operation of the redundancy system 300, as previously described. However, rather than disabling the decoders 120(1)–120(n), the drivers 730(1)–730(n) can be disabled before a memory access operation begins based on the static redundancy addresses programmed in the antifuse circuits (not shown). As a result, the decoder 120(1)–120(n) associated with a defective normal memory element will generate an active decode signal DECn in response to the AXY<i> signals output by the address predecoder 104, but the corresponding driver 730 will not generate a selection signal to drive the normal memory element. Thus, only the redundant driver 134(1)–134(m) for the redundant memory element to which the memory address of the defective normal memory element is mapped will be activated during the memory access operation.

Figure 8:
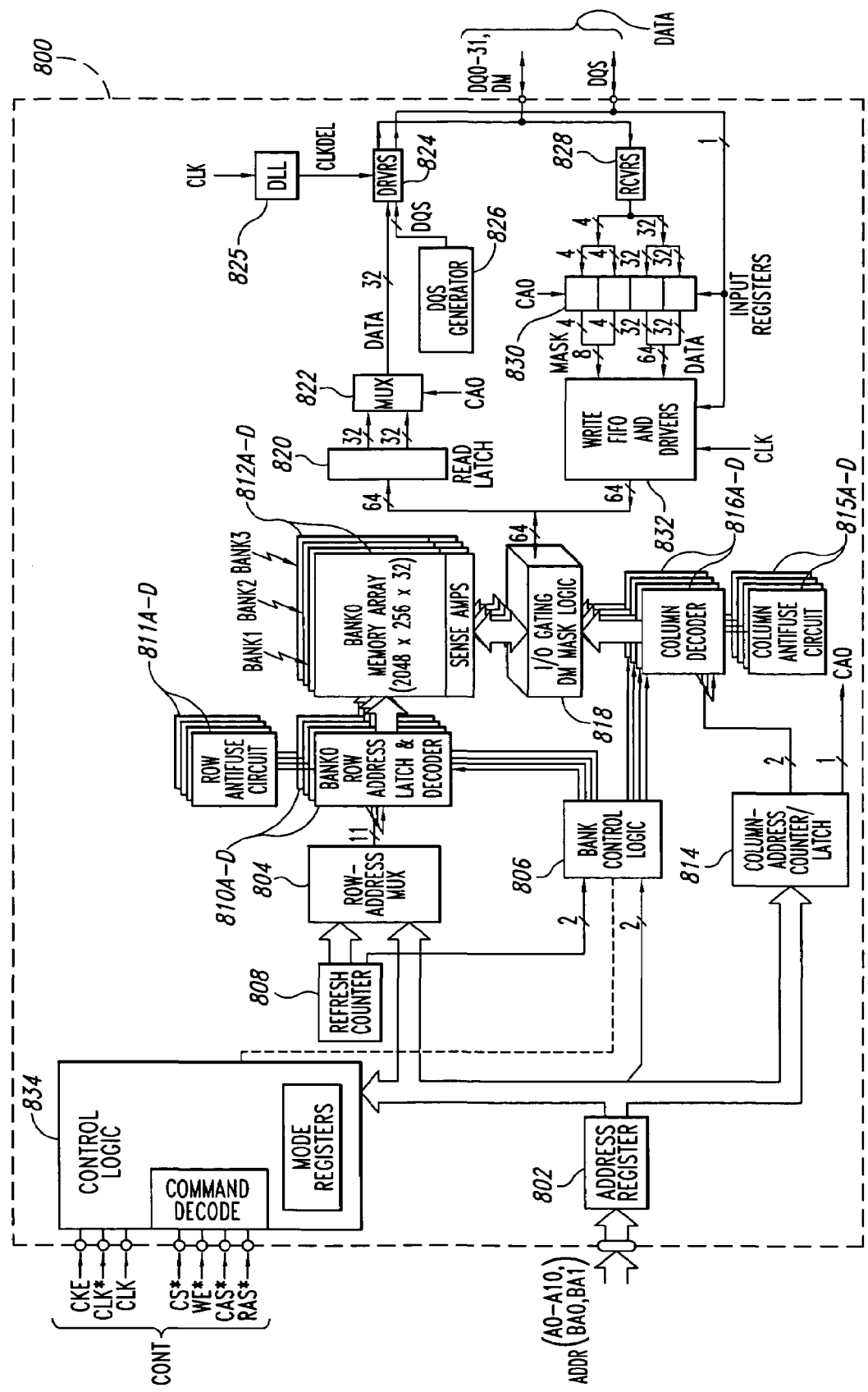
FIG. 8 is a functional block diagram illustrating a synchronous memory device including a redundancy system of FIG. 3 and/or the redundancy system of FIG. 7.

FIG. 8 is a functional block diagram of a memory device 800 including the redundancy system 300 of FIG. 3 and/or the redundancy system 700 of FIG. 7. The memory device 800 in FIG. 8 is a double-data rate (DDR) synchronous dynamic random access memory ("SDRAM"), although the principles described herein are applicable to any memory device that utilizes redundancy memory elements, such as conventional synchronous DRAMs (SDRAMs), as well as packetized memory devices like SLDRAMs and RDRAMs, and are equally applicable to any embedded memory having redundancy memory repair capability.

The memory device 800 includes an address register 802 that receives row, column, and bank addresses over an address bus ADDR, with a memory controller (not shown) typically supplying the addresses. The address register 802 receives a row address and a bank address that are applied to a row address multiplexer 804 and bank control logic circuit 806, respectively. The row address multiplexer 804 applies either the row address received from the address register 802 or a refresh row address from a refresh counter 808 to a plurality of row address latch and decoders 810A–D. The bank control logic 806 activates the row address latch and decoder 810A–D corresponding to either the bank address received from the address register 802 or a refresh bank address from the refresh counter 808, and the activated row address latch and decoder latches and decodes the received row address. Row antifuse circuits 811A–D include sets of antifuses that can be programmed with the addresses of the defective rows of memory. The row address latch and decoder 810A–D includes functional blocks for implementing a redundancy decode system according to an embodiment of the present invention, for example, the redundancy system 300 or 700 previously described.

In response to the decoded row address, the activated row address latch and decoder 810A–D applies various signals to a corresponding memory bank 812A–D to thereby activate a row of normal memory elements or redundancy memory elements corresponding to the decoded row address. Each memory bank 812A–D includes a memory-cell array having a plurality of memory cells arranged in rows and columns of normal memory elements or redundancy memory elements, and the data stored in the memory cells in the activated row is stored in sense amplifiers in the corresponding memory bank. The row address multiplexer 804 applies the refresh row address from the refresh counter 808 to the decoders 810A–D and the bank control logic circuit 806 uses the refresh bank address from the refresh counter when the memory device 800 operates in an auto-refresh or self-refresh mode of operation in response to an auto- or self-refresh command being applied to the memory device 800, as will be appreciated by those skilled in the art.

A column address is applied on the ADDR bus after the row and bank addresses, and the address register 802 applies the column address to a column address counter and latch 814 which, in turn, latches the column address and applies the latched column address to a plurality of column decoders 816A–D. Column antifuse circuits 815A–D include sets of antifuses that can be programmed with the addresses of the defective columns of memory. The column address counter and lath 814 includes functional blocks for implementing a redundancy decode system according to an embodiment of the present invention, for example, the redundancy systems 300 or 700. The bank control logic 806 activates the column decoder 816A–D corresponding to the received bank address, and the activated column decoder decodes the applied column address. Depending on the operating mode of the memory device 800, the column address counter and latch 814 either directly applies the latched column address to the decoders 816A–D, or applies a sequence of column addresses to the decoders starting at the column address provided by the address register 802. In response to the column address from the counter and latch 814, the activated column decoder 816A–D applies decode and control signals to an I/O gating and data masking circuit 818 which, in turn, accesses normal memory elements or redundant memory elements corresponding to the decoded column address in the activated row of memory cells in the memory bank 812A–D being accessed.

During data read operations, data being read from the addressed memory cells is coupled through the I/O gating and data masking circuit 818 to a read latch 820. The I/O gating and data masking circuit 818 supplies N bits of data to the read latch 820, which then applies two N/2 bit words to a multiplexer 822. In the embodiment of FIG. 3, the circuit 818 provides 64 bits to the read latch 820 which, in turn, provides two 32 bits words to the multiplexer 822. A data driver 824 sequentially receives the N/2 bit words from the multiplexer 822 and also receives a data strobe signal DQS from a strobe signal generator 826 and a delayed clock signal CLKDEL from a delay-locked loop 825. The DQS signal is used by an external circuit such as a memory controller (not shown) in latching data from the memory device 800 during read operations. In response to the delayed clock signal CLKDEL, the data driver 824 sequentially outputs the received N/2 bits words as a corresponding data word DQ, each data word being output in synchronism with a rising or falling edge of a CLK signal that is applied to clock the memory device 800. The data driver 824 also outputs the data strobe signal DQS having rising and falling edges in synchronism with rising and falling edges of the CLK signal, respectively. Each data word DQ and the data strobe signal DQS collectively define a data bus DATA. The DATA bus also includes masking signals DM0–M, which will be described in more detail below with reference to data write operations.

During data write operations, an external circuit such as a memory controller (not shown) applies N/2 bit data words DQ, the strobe signal DQS, and corresponding data masking signals DM on the data bus DATA. A data receiver 828 receives each DQ word and the associated DM signals, and applies these signals to input registers 830 that are clocked by the DQS signal. In response to a rising edge of the DQS signal, the input registers 830 latch a first N/2 bit DQ word and the associated DM signals, and in response to a falling edge of the DQS signal the input registers latch the second N/2 bit DQ word and associated DM signals. The input register 830 provides the two latched N/2 bit DQ words as an N-bit word to a write FIFO and driver 832, which clocks the applied DQ word and DM signals into the write FIFO and driver in response to the DQS signal. The DQ word is clocked out of the write FIFO and driver 832 in response to the CLK signal, and is applied to the I/O gating and masking circuit 818. The I/O gating and masking circuit 818 transfers the DQ word to the addressed memory cells in the accessed bank 812A–D subject to the DM signals, which may be used to selectively mask bits or groups of bits in the DQ words (i.e., in the write data) being written to the addressed memory cells.

A control logic and command decoder 834 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 834 latches and decodes an applied command, and generates a sequence of clocking and control signals that control the components 802–832 to execute the function of the applied command. The clock enable signal CKE enables clocking of the command decoder 834 by the clock signals CLK, CLK*. The command decoder 834 latches command and address signals at positive edges of the CLK, CLK* signals (i.e., the crossing point of CLK going high and CLK* going low), while the input registers 830 and data drivers 824 transfer data into and from, respectively, the memory device 800 in response to both edges of the data strobe signal DQS and thus at double the frequency of the clock signals CLK, CLK*. This is true because the DQS signal has the same frequency as the CLK, CLK* signals. The memory device 800 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 834 in generating the control and timing signals is conventional, and thus, for the sake of brevity, will not be described in more detail.

Figure 9:
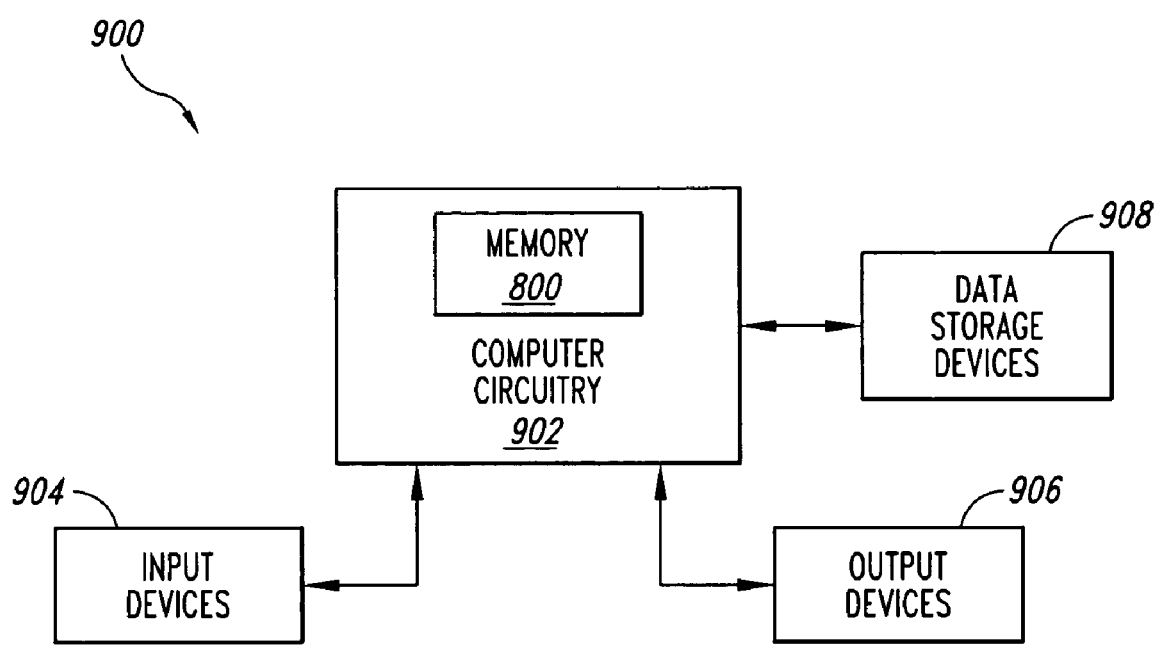
FIG. 9 is a functional block diagram illustrating a computer system including a synchronous memory device of FIG. 8.

FIG. 9 is a block diagram of a computer system 900 including computer circuitry 902 including the memory device 800 of FIG. 8. Typically, the computer circuitry 902 is coupled through address, data, and control buses to the memory device 800 to provide for writing data to and reading data from the memory device. The computer circuitry 902 includes circuitry for performing various computing functions, such as executing specific software to perform specific calculations or tasks. In addition, the computer system 900 includes one or more input devices 904, such as a keyboard or a mouse, coupled to the computer circuitry 902 to allow an operator to interface with the computer system. Typically, the computer system 900 also includes one or more output devices 906 coupled to the computer circuitry 902, such as output devices typically including a printer and a video terminal. One or more data storage devices 908 are also typically coupled to the computer circuitry 902 to store data or retrieve data from external storage media (not shown). Examples of typical storage devices 908 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. For example, the redundancy system 300 and 700 are shown as including disable logic 314(1)–314(n) that generate DISABLEn signals to disable a respective decoder 120(1)–120(n) or driver 130(1)–130(n). However, the decoders 120(1)–120(n) and the drivers 130(1)–130(n) can be modified to include logic circuits so that the antifuse decode signals FDECm_n from a respective row of antifuse decoders 310 are provided directly to the decoder 120 or the driver 130, rather than using disable logic 314 to generate a DISABLE signal that disables operation when a memory address is remapped to a redundant memory element. Such modifications are well within the skill of those ordinarily skilled in the art. Accordingly, the invention is not limited except as by the appended claims.

What is claimed is:

1. An address decoder receiving address signals and selecting a memory element in response to the address signals, the address decoder comprising:
   a first plurality of decoder circuits configured to select a memory element for an access operation according to the address signals;
   a plurality of redundancy circuits, each redundancy circuit having a set of programmable elements for programming a redundancy address corresponding to a memory element selected by one of the first plurality of decoder circuits;
   a second plurality of decoder circuits coupled to the plurality of redundancy circuits and configured to select a redundancy element for the access operation in response to receiving address signals matching one of the redundancy addresses programmed in the redundancy circuits; and
   a decoder disable circuit coupled to the first plurality of decoder circuits and further coupled to the plurality of redundancy circuits, based on the redundancy addresses programmed in the redundancy circuits, the decoder disable circuit configured to selectively and concurrently disable the decoder circuits of the first plurality that select the memory elements corresponding to the redundancy addresses programmed in the redundancy circuits.

2. The address decoder of claim 1 wherein each decoder circuit of the first plurality comprises a decode circuit and a driver circuit coupled to the decode circuit, the driver circuit having a disable node coupled to the decoder disable circuit to receive a disable signal and configured to drive a memory element to be accessed in response to an inactive disable signal and being activated by the decode circuit when selected by the address signals.

3. The address decoder of claim 1 wherein each decoder circuit of the first plurality comprises a decode circuit and a driver circuit coupled to the decode circuit, the decode circuit having a disable node coupled to the decoder disable circuit to receive a disable signal and configured to activate the driver circuit to drive a memory element to be accessed in response to an inactive disable signal and being activated when selected by the address signals.

4. The address decoder of claim 1 wherein the programmable elements comprise antifuses.

5. The address decoder of claim 1 wherein the programmable elements comprise fuses.

6. The address decoder of claim 1 wherein the first plurality of decoder circuits comprises N decoder circuits, the second plurality of decoder circuits comprises M decoder circuits, and the decoder disable circuit comprises (N×M) redundancy decoder circuits and M redundancy predecoder circuits, M redundancy decoder circuits coupled to a respective one of the N decoder circuits and N redundancy decoders coupled to a respective one of the M redundancy predecoder circuits, each of the N redundancy decoders coupled to a respective one of the M redundancy predecoder circuits coupled to a different decoder circuit of the first plurality.

7. The address decoder of claim 6 wherein the plurality of redundancy circuits comprises M redundancy circuits, each redundancy circuit coupled to a respective one of the M redundancy decoder circuits.

8. An address decoder receiving address signals for a memory operation, the address decoder comprising:
   a first plurality of N decoder circuits, each decoder circuit having an input to which address predecode signals are applied, an output at which an address decode signal is provided, and a disable node at which a respective disable signal is applied, each of the N decoder circuits configured to generate an active address decode signal in response to an inactive disable signal applied to the disable node and address predecode signals activating the particular decoder circuit;
   an address predecoder circuit having an input to which the address signals are applied and having an output coupled to the inputs of the N decoder circuits at which address predecode signals are provided, the address predecoder circuit configured to generate address predecode signals based on the address signals to activate one of the N decoders in response to receiving the address signals;
   M redundancy address comparators, each comparator having a first input to which the address signals are applied, having a second input to which redundancy address signals are applied, and further having an output at which a match signal is provided, each comparator configured to generate an active address decode signal in response to receiving matching address signals and redundancy address signals;
   M redundancy address predecoder circuits, each redundancy predecoder circuit having an input at which respective redundancy address signals are applied and having an output at which redundancy address predecode signals are provided, each redundancy address predecoder circuit configured to generate redundancy address predecode signals based on the redundancy address signals;
   a plurality of (N×M) redundancy decoders, each redundancy decoder having an input at which redundancy address predecode signals are applied and further having an output at which a redundancy decode signal is provided, each redundancy decoder configured to generate an active redundancy decode signal in response to being activated by the redundancy address predecode signals, N redundancy decoders coupled to the output of a respective one of each of the M redundancy address predecoder circuits; and
   N logic circuits, each logic circuit having M inputs coupled to the output of M redundancy decoders, one redundancy decoder from each set of N redundancy decoders coupled to the output of a respective one of each of the M redundancy address predecoder circuits, each logic circuit further having an output coupled to the disable node of a respective one of the first plurality of N decoder circuits and configured to generate an active disable signal in response to any of the M redundancy decoders to which the logic circuit is coupled providing an active redundancy decode signal.

9. The address decoder of claim 8, further comprising a second plurality of M decoder circuits, each decoder circuit having an input coupled to a respective one of the M redundancy address comparators and having an output at which an address decode signal is provided, each of the M decoder circuits configured to generate the active address decode signal in response to receiving an active match signal from a respective comparator.

10. The address decoder of claim 8 wherein the N logic circuits comprises N Boolean NAND gates.

11. The address decoder of claim 8, further comprising a first plurality of N driver circuits and a second plurality of M driver circuits, the N driver circuits coupled to a respective one of the N decoder circuits and the M driver circuits coupled to a respective one of the M redundancy address comparators, each driver circuit configured to generate an active memory element activation signal to access a respective memory element in response to an active address decode signal.

12. The address decoder of claim 8 wherein each redundancy address predecoder circuit is configured to generate redundancy address predecode signals in response to receiving redundancy address signals representative of a defective memory element to activate one of the N redundancy decoders to which the redundancy address predecoder circuit is coupled, the activated redundancy decoder coupled to the decoder circuit of the first plurality associated with the defective memory element corresponding to the redundancy address signals.

13. A redundancy system, comprising:
   a redundancy domain having a plurality of normal memory elements and at least one redundant memory element, the normal elements corresponding to a respective memory address and the redundant memory elements configured to have a memory address of the domain mapped thereto;
   a plurality of driver circuits, each driver circuit coupled to a respective one of the normal memory elements or a respective redundant memory element;
   a plurality of decoder circuits, each decoder circuit coupled to a respective one of the plurality of driver circuits that is coupled to a respective one of the normal memory elements and configured to activate the respective driver circuit to access the memory element to which the driver circuit is coupled;

an address predecoder coupled to the decoder circuits, the address predecoder configured to generate predecode signals in response to receiving an input memory address to select the decoder circuit coupled to the driver circuit that is coupled to the normal memory element corresponding to the input memory address;

a plurality of disable circuits coupled to a respective one of the decoder circuits, each of the disable circuits configured to disable the respective decoder circuit to which it is coupled in response to receiving an active redundancy decode signal;

a plurality of redundancy decoders coupled to the plurality of disable circuits, each disable circuit coupled to a number of redundancy decoders, the number equal to the number of redundant memory elements of the domain, each redundancy decoder configured to generate an active redundancy decode signal to cause the respective disable circuit to disable the respective decoder circuit in response to receiving redundancy predecode signals selecting the particular redundancy decoder;

a plurality of redundancy predecoder circuits coupled to the plurality of redundancy decoders, each redundancy predecoder circuit coupled to one of the redundancy decoders coupled to each disable circuit and configured to generate redundancy predecode signals in response to receiving programmed redundancy address signals to select a redundancy decoder to which it is coupled to generate an active redundancy decode signal and disable the decoder circuit coupled to the normal element corresponding to the programmed redundancy address signals;

a plurality of redundancy address circuits coupled to a respective one of the plurality of redundancy predecoder circuits, each redundancy address circuit having programmable elements for programming a redundancy address corresponding to a defective normal memory element and configured to generate corresponding programmed redundancy address signals for the redundancy predecoder circuit to which it is coupled in response to having a redundancy address programmed therein; and a plurality of comparators coupled to a respective one of the plurality of redundancy address circuits and further coupled to a respective one of the driver circuits coupled to a respective redundant memory element, each comparator configured to generate an activation signal to cause the respective driver circuit to access the redundant memory element to which the respective driver circuit is coupled in response to receiving a memory address matching the programmed redundancy address signals.

14. The redundancy system of claim 13 wherein the plurality of decoder circuits coupled to the plurality of driver circuits that are coupled to the normal memory elements are a first plurality of decoders, and the redundancy system further comprises a second plurality of decoder circuits coupled to a respective one of the plurality of comparators and further coupled to a respective one of the drivers coupled to a respective one of the redundant memory elements, each decoder circuit of the second plurality configured to activate the respective driver circuit to access the redundant memory element to which the driver circuit is coupled in response to receiving an activation signal from the respective comparator.

15. A redundancy system, comprising:

a redundancy domain having a plurality of normal memory elements and at least one redundant memory element, the normal elements corresponding to a respective memory address and the redundant memory elements configured to have a memory address of the domain mapped thereto;

a plurality of driver circuits, each driver circuit coupled to a respective one of the normal memory elements or a respective redundant memory element, each driver circuit coupled to a respective one of the normal memory elements configured to drive the memory element to which it is coupled in response to being activated and further configured to be disabled in response to receiving an active disable signal;

a plurality of decoder circuits, each decoder circuit coupled to a respective one of the plurality of driver circuits that is coupled to a respective one of the normal memory elements and configured to activate the respective driver circuit to access the memory element to which the driver circuit is coupled when selected;

an address predecoder coupled to the decoder circuits, the address predecoder configured to generate predecode signals in response to receiving an input memory address to select the decoder circuit coupled to the driver circuit that is coupled to the normal memory element corresponding to the input memory address;

a plurality of disable circuits coupled to a respective one of the driver circuits coupled to a respective normal memory element, each of the disable circuits configured to generate an active disable signal to disable the respective driver circuit to which it is coupled in response to receiving an active redundancy decode signal;

a plurality of redundancy decoders coupled to the plurality of disable circuits, each disable circuit coupled to a number of redundancy decoders, the number equal to the number of redundant memory elements of the domain, each redundancy decoder configured to generate an active redundancy decode signal to cause the respective disable circuit to disable the respective decoder circuit in response to receiving redundancy predecode signals selecting the particular redundancy decoder;

a plurality of redundancy predecoder circuits coupled to the plurality of redundancy decoders, each redundancy predecoder circuit coupled to one of the redundancy decoders coupled to each disable circuit and configured to generate redundancy predecode signals in response to receiving programmed redundancy address signals to select a redundancy decoder to which it is coupled to generate an active redundancy decode signal and disable the driver circuit coupled to the normal element corresponding to the programmed redundancy address signals;

a plurality of redundancy address circuits coupled to a respective one of the plurality of redundancy predecoder circuits, each redundancy address circuit having programmable elements for programming a redundancy address corresponding to a defective normal memory element and configured to generate corresponding programmed redundancy address signals for the redundancy predecoder circuit to which it is coupled in response to having a redundancy address programmed therein; and a plurality of comparators coupled to a respective one of the plurality of redundancy address circuits and further coupled to a respective one of the driver circuits coupled to a respective redundant memory element, each comparator configured to generate an activation signal to cause the respective driver circuit to access the redundant memory element to which the respective driver circuit is coupled in response to receiving a memory address matching the programmed redundancy address signals.

16. The redundancy system of claim 15 wherein the plurality of decoder circuits coupled to the plurality of driver circuits that are coupled to the normal memory elements are a first plurality of decoders, and the redundancy system further comprises a second plurality of decoder circuits coupled to a respective one of the plurality of comparators and further coupled to a respective one of the drivers coupled to a respective one of the redundant memory elements, each decoder circuit of the second plurality configured to activate the respective driver circuit to access the redundant memory element to which the driver circuit is coupled in response to receiving an activation signal from the respective comparator.

17. A redundancy system, comprising:
  a redundancy domain having a plurality of normal memory elements and at least one redundant memory element, the normal elements corresponding to a respective memory address and the redundant memory elements configured to have a memory address of the domain mapped thereto;
  a plurality of driver circuits, each driver circuit coupled to a respective one of the normal memory elements or a respective redundant memory element;
  a plurality of decoder circuits, each decoder circuit coupled to a respective one of the plurality of driver circuits that is coupled to a respective one of the normal memory elements and configured to activate the respective driver circuit to access the memory element to which the driver circuit is coupled, each decoder circuit further configured to be disabled in response to receiving an active redundancy decode signal;
  an address predecoder coupled to the decoder circuits, the address predecoder configured to generate predecode signals in response to receiving an input memory address to select the decoder circuit coupled to the driver circuit that is coupled to the normal memory element corresponding to the input memory address;
  a plurality of redundancy decoders coupled to the plurality of decoder circuits, each decoder circuit coupled to a number of redundancy decoders, the number equal to the number of redundant memory elements of the domain, each redundancy decoder configured to generate an active redundancy decode signal to disable the respective decoder circuit in response to receiving redundancy predecode signals selecting the particular redundancy decoder;
  a plurality of redundancy predecoder circuits coupled to the plurality of redundancy decoders, each redundancy predecoder circuit coupled to one of the redundancy decoders coupled to each decoder circuit and configured to generate redundancy predecode signals in response to receiving programmed redundancy address signals to select a redundancy decoder to which it is coupled to generate an active redundancy decode signal and disable the decoder circuit coupled to the normal element corresponding to the programmed redundancy address signals;
  a plurality of redundancy address circuits coupled to a respective one of the plurality of redundancy predecoder circuits, each redundancy address circuit having programmable elements for programming a redundancy address corresponding to a defective normal memory element and configured to generate corresponding programmed redundancy address signals for the redundancy predecoder circuit to which it is coupled in response to having a redundancy address programmed therein; and
  a plurality of comparators coupled to a respective one of the plurality of redundancy address circuits and further coupled to a respective one of the driver circuits coupled to a respective redundant memory element, each comparator configured to generate an activation signal to cause the respective driver circuit to access the redundant memory element to which the respective driver circuit is coupled in response to receiving a memory address matching the programmed redundancy address signals.

18. The redundancy system of claim 17 wherein the plurality of decoder circuits coupled to the plurality of driver circuits that are coupled to the normal memory elements are a first plurality of decoders, and the redundancy system further comprises a second plurality of decoder circuits coupled to a respective one of the plurality of comparators and further coupled to a respective one of the drivers coupled to a respective one of the redundant memory elements, each decoder circuit of the second plurality configured to activate the respective driver circuit to access the redundant memory element to which the driver circuit is coupled in response to receiving an activation signal from the respective comparator.

19. A redundancy system, comprising:
  a redundancy domain having a plurality of normal memory elements and at least one redundant memory element, the normal elements corresponding to a respective memory address and the redundant memory elements configured to have a memory address of the domain mapped thereto;
  a plurality of driver circuits, each driver circuit coupled to a respective one of the normal memory elements or a respective redundant memory element, each driver circuit coupled to a respective one of the normal memory elements configured to drive the memory element to which it is coupled in response to being activated and further configured to be disabled in response to receiving an active redundancy decode signal;
  a plurality of decoder circuits, each decoder circuit coupled to a respective one of the plurality of driver circuits that is coupled to a respective one of the normal memory elements and configured to activate the respective driver circuit to access the memory element to which the driver circuit is coupled;
  an address predecoder coupled to the decoder circuits, the address predecoder configured to generate predecode signals in response to receiving an input memory address to select the decoder circuit coupled to the driver circuit that is coupled to the normal memory element corresponding to the input memory address;
  a plurality of redundancy decoders coupled to the plurality of driver circuits, each driver circuit coupled to a number of redundancy decoders, the number equal to the number of redundant memory elements of the domain, each redundancy decoder configured to generate an active redundancy decode signal to disable the respective driver circuit in response to receiving redundancy predecode signals selecting the particular redundancy decoder;
a plurality of redundancy predecoder circuits coupled to the plurality of redundancy decoders, each redundancy predecoder circuit coupled to one of the redundancy decoders coupled to each disable circuit and configured to generate redundancy predecode signals in response to receiving programmed redundancy address signals to select a redundancy decoder to which it is coupled to generate an active redundancy decode signal and disable the driver circuit coupled to the normal element corresponding to the programmed redundancy address signals;
a plurality of redundancy address circuits coupled to a respective one of the plurality of redundancy predecoder circuits, each redundancy address circuit having programmable elements for programming a redundancy address corresponding to a defective normal memory element and configured to generate corresponding programmed redundancy address signals for the redundancy predecoder circuit to which it is coupled in response to having a redundancy address programmed therein; and
a plurality of comparators coupled to a respective one of the plurality of redundancy address circuits and further coupled to a respective one of the driver circuits coupled to a respective redundant memory element, each comparator configured to generate an activation signal to cause the respective driver circuit to access the redundant memory element to which the respective driver circuit is coupled in response to receiving a memory address matching the programmed redundancy address signals.

20. The redundancy system of claim 19 wherein the plurality of decoder circuits coupled to the plurality of driver circuits that are coupled to the normal memory elements are a first plurality of decoders, and the redundancy system further comprises a second plurality of decoder circuits coupled to a respective one of the plurality of comparators and further coupled to a respective one of the drivers coupled to a respective one of the redundant memory elements, each decoder circuit of the second plurality configured to activate the respective driver circuit to access the redundant memory element to which the driver circuit is coupled in response to receiving an activation signal from the respective comparator.

21. A memory device comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit, the memory-cell array having a plurality of memory elements arranged in rows and columns; and
a redundancy system coupled to the address decoder and the memory-cell array, the redundancy system receiving address signals and selecting a memory element in response to the address signals, the redundancy system comprising:
a first plurality of decoder circuits configured to select a memory element for an access operation according to the address signals;
a plurality of redundancy circuits, each redundancy circuit having a set of programmable elements for programming a redundancy address corresponding to a memory element selected by one of the first plurality of decoder circuits;
a second plurality of decoder circuits coupled to the plurality of redundancy circuits and configured to select a redundancy element for the access operation in response to receiving address signals matching one of the redundancy addresses programmed in the redundancy circuits; and
a decoder disable circuit coupled to the first plurality of decoder circuits and further coupled to the plurality of redundancy circuits, based on the redundancy addresses programmed in the redundancy circuits, the decoder disable circuit configured to selectively and concurrently disable the decoder circuits of the first plurality that select the memory elements corresponding to the redundancy addresses programmed in the redundancy circuits.

22. The memory device of claim 21 wherein each decoder circuit of the first plurality comprises a decode circuit and a driver circuit coupled to the decode circuit, the driver circuit having a disable node coupled to the decoder disable circuit to receive a disable signal and configured to drive a memory element to be accessed in response to an inactive disable signal and being activated by the decode circuit when selected by the address signals.

23. The memory device of claim 21 wherein each decoder circuit of the first plurality comprises a decode circuit and a driver circuit coupled to the decode circuit, the decode circuit having a disable node coupled to the decoder disable circuit to receive a disable signal and configured to activate the driver circuit to drive a memory element to be accessed in response to an inactive disable signal and being activated when selected by the address signals.

24. The memory device of claim 21 wherein the programmable elements comprise antifuses.

25. The memory device of claim 21 wherein the programmable elements comprise fuses.

26. The memory device of claim 21 wherein the first plurality of decoder circuits comprises N decoder circuits, the second plurality of decoder circuits comprises M decoder circuits, and the decoder disable circuit comprises (N×M) redundancy decoder circuits and M redundancy predecoder circuits, M redundancy decoder circuits coupled to a respective one of the N decoder circuits and N redundancy decoders coupled to a respective one of the M redundancy predecoder circuits, each of the N redundancy decoders coupled to a respective one of the M redundancy predecoder circuits coupled to a different decoder circuit of the first plurality.

27. The memory device of claim 26 wherein the plurality of redundancy circuits comprises M redundancy circuits, each redundancy circuit coupled to a respective one of the M redundancy decoder circuits.

28. A memory device comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit, the memory-cell array having a plurality of memory elements arranged in rows and columns; and a redundancy system coupled to the address decoder and the memory-cell array, the redundancy system receiving address signals and selecting a memory element in response to the address signals, the redundancy system comprising:
   a first plurality of N decoder circuits, each decoder circuit having an input to which address predecode signals are applied, an output at which an address decode signal is provided, and a disable node at which a respective disable signal is applied, each of the N decoder circuits configured to generate an active address decode signal in response to an inactive disable signal applied to the disable node and address predecode signals activating the particular decoder circuit;
   an address predecoder circuit having an input to which the address signals are applied and having an output coupled to the inputs of the N decoder circuits at which address predecode signals are provided, the address predecoder circuit configured to generate address predecode signals based on the address signals to activate one of the N decoders in response to receiving the address signals;
   M redundancy address comparators, each comparator having a first input to which the address signals are applied, having a second input to which redundancy address signals are applied, and further having an output at which a match signal is provided, each comparator configured to generate an active address decode signal in response to receiving matching address signals and redundancy address signals;
   M redundancy address predecoder circuits, each redundancy predecoder circuit having an input at which respective redundancy address signals are applied and having an output at which redundancy address predecode signals are provided, each redundancy address predecoder circuit configured to generate redundancy address predecode signals based on the redundancy address signals;
   a plurality of (N×M) redundancy decoders, each redundancy decoder having an input at which redundancy address predecode signals are applied and further having an output at which a redundancy decode signal is provided, each redundancy decoder configured to generate an active redundancy decode signal in response to being activated by the redundancy address predecode signals, N redundancy decoders coupled to the output of a respective one of each of the M redundancy address predecoder circuits; and
   N logic circuits, each logic circuit having M inputs coupled to the output of M redundancy decoders, one redundancy decoder from each set of N redundancy decoders coupled to the output of a respective one of each of the M redundancy address predecoder circuits, each logic circuit further having an output coupled to the disable node of a respective one of the first plurality of N decoder circuits and configured to generate an active disable signal in response to any of the M redundancy decoders to which the logic circuit is coupled providing an active redundancy decode signal.

29. The memory device of claim 28, further comprising a second plurality of M decoder circuits, each decoder circuit having an input coupled to a respective one of the M redundancy address comparators and having an output at which an address decode signal is provided, each of the M decoder circuits configured to generate the active address decode signal in response to receiving an active match signal from a respective comparator.

30. The memory device of claim 28 wherein the N logic circuits comprises N Boolean NAND gates.

31. The memory device of claim 28, further comprising a first plurality of N driver circuits and a second plurality of M driver circuits, the N driver circuits coupled to a respective one of the N decoder circuits and the M driver circuits coupled to a respective one of the M redundancy address comparators, each driver circuit configured to generate an active memory element activation signal to access a respective memory element in response to an active address decode signal.

32. The memory device of claim 28 wherein each redundancy address predecoder circuit is configured to generate redundancy address predecode signals in response to receiving redundancy address signals representative of a defective memory element to activate one of the N redundancy decoders to which the redundancy address predecoder circuit is coupled, the activated redundancy decoder coupled to the decoder circuit of the first plurality associated with the defective memory element corresponding to the redundancy address signals.

33. A memory device comprising:
   an address bus;
   a control bus;
   a data bus;
   an address decoder coupled to the address bus;
   a read/write circuit coupled to the data bus;
   a control circuit coupled to the control bus;
   a memory-cell array coupled to the address decoder, control circuit, and read/write circuit, the memory-cell array having a redundancy domain having a plurality of normal memory elements and at least one redundant memory element, the normal elements corresponding to a respective memory address and the redundant memory elements configured to have a memory address of the domain mapped thereto; and
   a redundancy system coupled to the address decoder and the memory-cell array, the redundancy receiving address signals and selecting a memory element in response to the address signals, the redundancy system comprising:
      a plurality of driver circuits, each driver circuit coupled to a respective one of the normal memory elements or a respective redundant memory element;
      a plurality of decoder circuits, each decoder circuit coupled to a respective one of the plurality of driver circuits that is coupled to a respective one of the normal memory elements and configured to activate the respective driver circuit to access the memory element to which the driver circuit is coupled;
      an address predecoder coupled to the decoder circuits, the address predecoder configured to generate predecode signals in response to receiving an input memory address to select the decoder circuit coupled to the driver circuit that is coupled to the normal memory element corresponding to the input memory address;
      a plurality of disable circuits coupled to a respective one of the decoder circuits, each of the disable circuits configured to disable the respective decoder circuit to which it is coupled in response to receiving an active redundancy decode signal;
      a plurality of redundancy decoders coupled to the plurality of disable circuits, each disable circuit coupled to a number of redundancy decoders, the number equal to the number of redundant memory elements of the domain, each redundancy decoder configured to generate an active redundancy decode signal to cause the respective disable circuit to disable the respective decoder circuit in response to receiving redundancy predecode signals selecting the particular redundancy decoder;

a plurality of redundancy predecoder circuits coupled to the plurality of redundancy decoders, each redundancy predecoder circuit coupled to one of the redundancy decoders coupled to each disable circuit and configured to generate redundancy predecode signals in response to receiving programmed redundancy address signals to select a redundancy decoder to which it is coupled to generate an active redundancy decode signal and disable the decoder circuit coupled to the normal element corresponding to the programmed redundancy address signals;

a plurality of redundancy address circuits coupled to a respective one of the plurality of redundancy predecoder circuits, each redundancy address circuit having programmable elements for programming a redundancy address corresponding to a defective normal memory element and configured to generate corresponding programmed redundancy address signals for the redundancy predecoder circuit to which it is coupled in response to having a redundancy address programmed therein; and a plurality of comparators coupled to a respective one of the plurality of redundancy address circuits and further coupled to a respective one of the driver circuits coupled to a respective redundant memory element, each comparator configured to generate an activation signal to cause the respective driver circuit to access the redundant memory element to which the respective driver circuit is coupled in response to receiving a memory address matching the programmed redundancy address signals.

34. The memory device of claim 33 wherein the plurality of decoder circuits coupled to the plurality of driver circuits that are coupled to the normal memory elements are a first plurality of decoders, and the redundancy system further comprises a second plurality of decoder circuits coupled to a respective one of the plurality of comparators and further coupled to a respective one of the drivers coupled to a respective one of the redundant memory elements, each decoder circuit of the second plurality configured to activate the respective driver circuit to access the redundant memory element to which the driver circuit is coupled in response to receiving an activation signal from the respective comparator.

35. A memory device comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit, the memory-cell array having a redundancy domain having a plurality of normal memory elements and at least one redundant memory element, the normal elements corresponding to a respective memory address and the redundant memory elements configured to have a memory address of the domain mapped thereto; and a redundancy system coupled to the address decoder and the memory-cell array, the redundancy receiving address signals and selecting a memory element in response to the address signals, the redundancy system comprising:

a plurality of driver circuits, each driver circuit coupled to a respective one of the normal memory elements or a respective redundant memory element, each driver circuit coupled to a respective one of the normal memory elements configured to drive the memory element to which it is coupled in response to being activated and further configured to be disabled in response to receiving an active disable signal;

a plurality of decoder circuits, each decoder circuit coupled to a respective one of the plurality of driver circuits that is coupled to a respective one of the normal memory elements and configured to activate the respective driver circuit to access the memory element to which the driver circuit is coupled when selected;

an address predecoder coupled to the decoder circuits, the address predecoder configured to generate predecode signals in response to receiving an input memory address to select the decoder circuit coupled to the driver circuit that is coupled to the normal memory element corresponding to the input memory address;

a plurality of disable circuits coupled to a respective one of the driver circuits coupled to a respective normal memory element, each of the disable circuits configured to generate an active disable signal to disable the respective driver circuit to which it is coupled in response to receiving an active redundancy decode signal;

a plurality of redundancy decoders coupled to the plurality of disable circuits, each disable circuit coupled to a number of redundancy decoders, the number equal to the number of redundant memory elements of the domain, each redundancy decoder configured to generate an active redundancy decode signal to cause the respective disable circuit to disable the respective decoder circuit in response to receiving redundancy predecode signals selecting the particular redundancy decoder;

a plurality of redundancy predecoder circuits coupled to the plurality of redundancy decoders, each redundancy predecoder circuit coupled to one of the redundancy decoders coupled to each disable circuit and configured to generate redundancy predecode signals in response to receiving programmed redundancy address signals to select a redundancy decoder to which it is coupled to generate an active redundancy decode signal and disable the driver circuit coupled to the normal element corresponding to the programmed redundancy address signals;

a plurality of redundancy address circuits coupled to a respective one of the plurality of redundancy predecoder circuits, each redundancy address circuit having programmable elements for programming a redundancy address corresponding to a defective normal memory element and configured to generate corresponding programmed redundancy address signals for the redundancy predecoder circuit to which it is coupled in response to having a redundancy address programmed therein; and a plurality of comparators coupled to a respective one of the plurality of redundancy address circuits and further coupled to a respective one of the driver circuits coupled to a respective redundant memory element, each comparator configured to generate an activation signal to cause the respective driver circuit to access the redundant memory element to which the respective driver circuit is coupled in response to receiving a memory address matching the programmed redundancy address signals.

36. The memory device of claim 35 wherein the plurality of decoder circuits coupled to the plurality of driver circuits that are coupled to the normal memory elements are a first plurality of decoders, and the redundancy system further comprises a second plurality of decoder circuits coupled to a respective one of the plurality of comparators and further coupled to a respective one of the drivers coupled to a respective one of the redundant memory elements, each decoder circuit of the second plurality configured to activate the respective driver circuit to access the redundant memory element to which the driver circuit is coupled in response to receiving an activation signal from the respective comparator.

37. A memory device comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit, the memory-cell array having a redundancy domain having a plurality of normal memory elements and at least one redundant memory element, the normal elements corresponding to a respective memory address and the redundant memory elements configured to have a memory address of the domain mapped thereto; and
a redundancy system coupled to the address decoder and the memory-cell array, the redundancy receiving address signals and selecting a memory element in response to the address signals, the redundancy system comprising:
  a plurality of driver circuits, each driver circuit coupled to a respective one of the normal memory elements or a respective redundant memory element;
  a plurality of decoder circuits, each decoder circuit coupled to a respective one of the plurality of driver circuits that is coupled to a respective one of the normal memory elements and configured to activate the respective driver circuit to access the memory element to which the driver circuit is coupled, each decoder circuit further configured to be disabled in response to receiving an active redundancy decode signal;
  an address predecoder coupled to the decoder circuits, the address predecoder configured to generate predecode signals in response to receiving an input memory address to select the decoder circuit coupled to the driver circuit that is coupled to the normal memory element corresponding to the input memory address;
  a plurality of redundancy decoders coupled to the plurality of decoder circuits, each decoder circuit coupled to a number of redundancy decoders, the number equal to the number of redundant memory elements of the domain, each redundancy decoder configured to generate an active redundancy decode signal to disable the respective decoder circuit in response to receiving redundancy predecode signals selecting the particular redundancy decoder;
  a plurality of redundancy predecoder circuits coupled to the plurality of redundancy decoders, each redundancy predecoder circuit coupled to one of the redundancy decoders coupled to each decoder circuit and configured to generate redundancy predecode signals in response to receiving programmed redundancy address signals to select a redundancy decoder to which it is coupled to generate an active redundancy decode signal and disable the decoder circuit coupled to the normal element corresponding to the programmed redundancy address signals;
  a plurality of redundancy address circuits coupled to a respective one of the plurality of redundancy predecoder circuits, each redundancy address circuit having programmable elements for programming a redundancy address corresponding to a defective normal memory element and configured to generate corresponding programmed redundancy address signals for the redundancy predecoder circuit to which it is coupled in response to having a redundancy address programmed therein; and
  a plurality of comparators coupled to a respective one of the plurality of redundancy address circuits and further coupled to a respective one of the driver circuits coupled to a respective redundant memory element, each comparator configured to generate an activation signal to cause the respective driver circuit to access the redundant memory element to which the respective driver circuit is coupled in response to receiving a memory address matching the programmed redundancy address signals.

38. The memory device of claim 37 wherein the plurality of decoder circuits coupled to the plurality of driver circuits that are coupled to the normal memory elements are a first plurality of decoders, and the redundancy system further comprises a second plurality of decoder circuits coupled to a respective one of the plurality of comparators and further coupled to a respective one of the drivers coupled to a respective one of the redundant memory elements, each decoder circuit of the second plurality configured to activate the respective driver circuit to access the redundant memory element to which the driver circuit is coupled in response to receiving an activation signal from the respective comparator.

39. A memory device comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit, the memory-cell array having a redundancy domain having a plurality of normal memory elements and at least one redundant memory element, the normal elements corresponding to a respective memory address and the redundant memory elements configured to have a memory address of the domain mapped thereto; and
a redundancy system coupled to the address decoder and the memory-cell array, the redundancy receiving address signals and selecting a memory element in response to the address signals, the redundancy system comprising:
- a plurality of driver circuits, each driver circuit coupled to a respective one of the normal memory elements or a respective redundant memory element, each driver circuit coupled to a respective one of the normal memory elements configured to drive the memory element to which it is coupled in response to being activated and further configured to be disabled in response to receiving an active redundancy decode signal;
- a plurality of decoder circuits, each decoder circuit coupled to a respective one of the plurality of driver circuits that is coupled to a respective one of the normal memory elements and configured to activate the respective driver circuit to access the memory element to which the driver circuit is coupled;
- an address predecoder coupled to the decoder circuits, the address predecoder configured to generate predecode signals in response to receiving an input memory address to select the decoder circuit coupled to the driver circuit that is coupled to the normal memory element corresponding to the input memory address;
- a plurality of redundancy decoders coupled to the plurality of driver circuits, each driver circuit coupled to a number of redundancy decoders, the number equal to the number of redundant memory elements of the domain, each redundancy decoder configured to generate an active redundancy decode signal to disable the respective driver circuit in response to receiving redundancy predecode signals selecting the particular redundancy decoder;
- a plurality of redundancy predecoder circuits coupled to the plurality of redundancy decoders, each redundancy predecoder circuit coupled to one of the redundancy decoders coupled to each disable circuit and configured to generate redundancy predecode signals in response to receiving programmed redundancy address signals to select a redundancy decoder to which it is coupled to generate an active redundancy decode signal and disable the driver circuit coupled to the normal element corresponding to the programmed redundancy address signals;
- a plurality of redundancy address circuits coupled to a respective one of the plurality of redundancy predecoder circuits, each redundancy address circuit having programmable elements for programming a redundancy address corresponding to a defective normal memory element and configured to generate corresponding programmed redundancy address signals for the redundancy predecoder circuit to which it is coupled in response to having a redundancy address programmed therein; and
- a plurality of comparators coupled to a respective one of the plurality of redundancy address circuits and further coupled to a respective one of the driver circuits coupled to a respective redundant memory element, each comparator configured to generate an activation signal to cause the respective driver circuit to access the redundant memory element to which the respective driver circuit is coupled in response to receiving a memory address matching the programmed redundancy address signals.

40. The memory device of claim 39 wherein the plurality of decoder circuits coupled to the plurality of driver circuits that are coupled to the normal memory elements are a first plurality of decoders, and the redundancy system further comprises a second plurality of decoder circuits coupled to a respective one of the plurality of comparators and further coupled to a respective one of the drivers coupled to a respective one of the redundant memory elements, each decoder circuit of the second plurality configured to activate the respective driver circuit to access the redundant memory element to which the driver circuit is coupled in response to receiving an activation signal from the respective comparator.

41. A processor-based system, comprising:
- a data input device;
- a data output device;
- a processor coupled to the data input and output devices; and
- a memory device coupled to the processor, the memory device comprising,
  - an address bus;
  - a control bus;
  - a data bus;
  - an address decoder coupled to the address bus;
  - a read/write circuit coupled to the data bus;
  - a control circuit coupled to the control bus;
  - a memory-cell array coupled to the address decoder, control circuit, and read/write circuit, the memory-cell array having a plurality of memory elements arranged in rows and columns; and
  - a redundancy system coupled to the address decoder and the memory-cell array, the redundancy system receiving address signals and selecting a memory element in response to the address signals, the redundancy system comprising:
    - a first plurality of decoder circuits configured to select a memory element for an access operation according to the address signals;
    - a plurality of redundancy circuits, each redundancy circuit having a set of programmable elements for programming a redundancy address corresponding to a memory element selected by one of the first plurality of decoder circuits;
    - a second plurality of decoder circuits coupled to the plurality of redundancy circuits and configured to select a redundancy element for the access operation in response to receiving address signals matching one of the redundancy addresses programmed in the redundancy circuits; and
    - a decoder disable circuit coupled to the first plurality of decoder circuits and further coupled to the plurality of redundancy circuits, based on the redundancy addresses programmed in the redundancy circuits, the decoder disable circuit configured to selectively and concurrently disable the decoder circuits of the first plurality that select the memory elements corresponding to the redundancy addresses programmed in the redundancy circuits.

42. The processor-based system of claim 41 wherein each decoder circuit of the first plurality comprises a decode circuit and a driver circuit coupled to the decode circuit, the driver circuit having a disable node coupled to the decoder disable circuit to receive a disable signal and configured to drive a memory element to be accessed in response to an inactive disable signal and being activated by the decode circuit when selected by the address signals.

43. The processor-based system of claim 41 wherein each decoder circuit of the first plurality comprises a decode circuit and a driver circuit coupled to the decode circuit, the decode circuit having a disable node coupled to the decoder disable circuit to receive a disable signal and configured to activate the driver circuit to drive a memory element to be accessed in response to an inactive disable signal and being activated when selected by the address signals.

44. The processor-based system of claim 41 wherein the programmable elements comprise antifuses.

45. The processor-based system of claim 41 wherein the programmable elements comprise fuses.

46. The processor-based system of claim 41 wherein the first plurality of decoder circuits comprises N decoder circuits, the second plurality of decoder circuits comprises M decoder circuits, and the decoder disable circuit comprises (N×M) redundancy decoder circuits and M redundancy predecoder circuits, M redundancy decoder circuits coupled to a respective one of the N decoder circuits and N redundancy decoders coupled to a respective one of the M redundancy predecoder circuits, each of the N redundancy decoders coupled to a respective one of the M redundancy predecoder circuits coupled to a different decoder circuit of the first plurality.

47. The processor-based system of claim 46 wherein the plurality of redundancy circuits comprises M redundancy circuits, each redundancy circuit coupled to a respective one of the M redundancy decoder circuits.

48. A processor-based system, comprising:
a data input device;
a data output device;
a processor coupled to the data input and output devices; and
a memory device coupled to the processor, the memory device comprising,
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit, the memory-cell array having a plurality of memory elements arranged in rows and columns; and
a redundancy system coupled to the address decoder and the memory-cell array, the redundancy system receiving address signals and selecting a memory element in response to the address signals, the redundancy system comprising:
a first plurality of N decoder circuits, each decoder circuit having an input to which address predecode signals are applied, an output at which an address decode signal is provided, and a disable node at which a respective disable signal is applied, each of the N decoder circuits configured to generate an active address decode signal in response to an inactive disable signal applied to the disable node and address predecode signals activating the particular decoder circuit;
an address predecoder circuit having an input to which the address signals are applied and having an output coupled to the inputs of the N decoder circuits at which address predecode signals are provided, the address predecoder circuit configured to generate address predecode signals based on the address signals to activate one of the N decoders in response to receiving the address signals;

M redundancy address comparators, each comparator having a first input to which the address signals are applied, having a second input to which redundancy address signals are applied, and further having an output at which a match signal is provided, each comparator configured to generate an active address decode signal in response to receiving matching address signals and redundancy address signals;

M redundancy address predecoder circuits, each redundancy predecoder circuit having an input at which respective redundancy address signals are applied and having an output at which redundancy address predecode signals are provided, each redundancy address predecoder circuit configured to generate redundancy address predecode signals based on the redundancy address signals;

a plurality of (N×M) redundancy decoders, each redundancy decoder having an input at which redundancy address predecode signals are applied and further having an output at which a redundancy decode signal is provided, each redundancy decoder configured to generate an active redundancy decode signal in response to being activated by the redundancy address predecode signals, N redundancy decoders coupled to the output of a respective one of each of the M redundancy address predecoder circuits; and N logic circuits, each logic circuit having M inputs coupled to the output of M redundancy decoders, one redundancy decoder from each set of N redundancy decoders coupled to the output of a respective one of each of the M redundancy address predecoder circuits, each logic circuit further having an output coupled to the disable node of a respective one of the first plurality of N decoder circuits and configured to generate an active disable signal in response to any of the M redundancy decoders to which the logic circuit is coupled providing an active redundancy decode signal.

49. The processor-based system of claim 48, further comprising a second plurality of M decoder circuits, each decoder circuit having an input coupled to a respective one of the M redundancy address comparators and having an output at which an address decode signal is provided, each of the M decoder circuits configured to generate the active address decode signal in response to receiving an active match signal from a respective comparator.

50. The processor-based system of claim 48 wherein the N logic circuits comprises N Boolean NAND gates.

51. The processor-based system of claim 48, further comprising a first plurality of N driver circuits and a second plurality of M driver circuits, the N driver circuits coupled to a respective one of the N decoder circuits and the M driver circuits coupled to a respective one of the M redundancy address comparators, each driver circuit configured to generate an active memory element activation signal to access a respective memory element in response to an active address decode signal.

52. The processor-based system of claim 48 wherein each redundancy address predecoder circuit is configured to generate redundancy address predecode signals in response to receiving redundancy address signals representative of a defective memory element to activate one of the N redundancy decoders to which the redundancy address predecoder circuit is coupled, the activated redundancy decoder coupled to the decoder circuit of the first plurality associated with the defective memory element corresponding to the redundancy address signals.

53. A processor-based system, comprising:
- a data input device;
- a data output device;
- a processor coupled to the data input and output devices; and
- a memory device coupled to the processor, the memory device comprising,
  - an address bus;
  - a control bus;
  - a data bus;
  - an address decoder coupled to the address bus;
  - a read/write circuit coupled to the data bus;
  - a control circuit coupled to the control bus;
  - a memory-cell array coupled to the address decoder, control circuit, and read/write circuit, the memory-cell array having a redundancy domain having a plurality of normal memory elements and at least one redundant memory element, the normal elements corresponding to a respective memory address and the redundant memory elements configured to have a memory address of the domain mapped thereto; and
  - a redundancy system coupled to the address decoder and the memory-cell array, the redundancy receiving address signals and selecting a memory element in response to the address signals, the redundancy system comprising:
    - a plurality of driver circuits, each driver circuit coupled to a respective one of the normal memory elements or a respective redundant memory element;
    - a plurality of decoder circuits, each decoder circuit coupled to a respective one of the plurality of driver circuits that is coupled to a respective one of the normal memory elements and configured to activate the respective driver circuit to access the memory element to which the driver circuit is coupled;
    - an address predecoder coupled to the decoder circuits, the address predecoder configured to generate predecode signals in response to receiving an input memory address to select the decoder circuit coupled to the driver circuit that is coupled to the normal memory element corresponding to the input memory address;
    - a plurality of disable circuits coupled to a respective one of the decoder circuits, each of the disable circuits configured to disable the respective decoder circuit to which it is coupled in response to receiving an active redundancy decode signal;
    - a plurality of redundancy decoders coupled to the plurality of disable circuits, each disable circuit coupled to a number of redundancy decoders, the number equal to the number of redundant memory elements of the domain, each redundancy decoder configured to generate an active redundancy decode signal to cause the respective disable circuit to disable the respective decoder circuit in response to receiving redundancy predecode signals selecting the particular redundancy decoder;
    - a plurality of redundancy predecoder circuits coupled to the plurality of redundancy decoders, each redundancy predecoder circuit coupled to one of the redundancy decoders coupled to each disable circuit and configured to generate redundancy predecode signals in response to receiving programmed redundancy address signals to select a redundancy decoder to which it is coupled to generate an active redundancy decode signal and disable the decoder circuit coupled to the normal element corresponding to the programmed redundancy address signals;
    - a plurality of redundancy address circuits coupled to a respective one of the plurality of redundancy predecoder circuits, each redundancy address circuit having programmable elements for programming a redundancy address corresponding to a defective normal memory element and configured to generate corresponding programmed redundancy address signals for the redundancy predecoder circuit to which it is coupled in response to having a redundancy address programmed therein; and
    - a plurality of comparators coupled to a respective one of the plurality of redundancy address circuits and further coupled to a respective one of the driver circuits coupled to a respective redundant memory element, each comparator configured to generate an activation signal to cause the respective driver circuit to access the redundant memory element to which the respective driver circuit is coupled in response to receiving a memory address matching the programmed redundancy address signals.

54. The processor-based system of claim 53 wherein the plurality of decoder circuits coupled to the plurality of driver circuits that are coupled to the normal memory elements are a first plurality of decoders, and the redundancy system further comprises a second plurality of decoder circuits coupled to a respective one of the plurality of comparators and further coupled to a respective one of the drivers coupled to a respective one of the redundant memory elements, each decoder circuit of the second plurality configured to activate the respective driver circuit to access the redundant memory element to which the driver circuit is coupled in response to receiving an activation signal from the respective comparator.

55. A processor-based system, comprising:
- a data input device;
- a data output device;
- a processor coupled to the data input and output devices; and
- a memory device coupled to the processor, the memory device comprising,
  - an address bus;
  - a control bus;
  - a data bus;
  - an address decoder coupled to the address bus;
  - a read/write circuit coupled to the data bus;
  - a control circuit coupled to the control bus;
  - a memory-cell array coupled to the address decoder, control circuit, and read/write circuit, the memory-cell array having a redundancy domain having a plurality of normal memory elements and at least one redundant memory element, the normal elements corresponding to a respective memory address and the redundant memory elements configured to have a memory address of the domain mapped thereto; and
  - a redundancy system coupled to the address decoder and the memory-cell array, the redundancy receiving address signals and selecting a memory element in response to the address signals, the redundancy system comprising:
  a plurality of driver circuits, each driver circuit coupled to a respective one of the normal memory elements or a respective redundant memory element, each driver circuit coupled to a respective one of the normal memory elements configured to drive the memory element to which it is coupled in response to being activated and further configured to be disabled in response to receiving an active disable signal;
  a plurality of decoder circuits, each decoder circuit coupled to a respective one of the plurality of driver circuits that is coupled to a respective one of the normal memory elements and configured to activate the respective driver circuit to access the memory element to which the driver circuit is coupled when selected;
  an address predecoder coupled to the decoder circuits, the address predecoder configured to generate predecode signals in response to receiving an input memory address to select the decoder circuit coupled to the driver circuit that is coupled to the normal memory element corresponding to the input memory address;
  a plurality of disable circuits coupled to a respective one of the driver circuits coupled to a respective normal memory element, each of the disable circuits configured to generate an active disable signal to disable the respective driver circuit to which it is coupled in response to receiving an active redundancy decode signal;
  a plurality of redundancy decoders coupled to the plurality of disable circuits, each disable circuit coupled to a number of redundancy decoders, the number equal to the number of redundant memory elements of the domain, each redundancy decoder configured to generate an active redundancy decode signal to cause the respective disable circuit to disable the respective decoder circuit in response to receiving redundancy predecode signals selecting the particular redundancy decoder;
  a plurality of redundancy predecoder circuits coupled to the plurality of redundancy decoders, each redundancy predecoder circuit coupled to one of the redundancy decoders coupled to each disable circuit and configured to generate redundancy predecode signals in response to receiving programmed redundancy address signals to select a redundancy decoder to which it is coupled to generate an active redundancy decode signal and disable the driver circuit coupled to the normal element corresponding to the programmed redundancy address signals;
  a plurality of redundancy address circuits coupled to a respective one of the plurality of redundancy predecoder circuits, each redundancy address circuit having programmable elements for programming a redundancy address corresponding to a defective normal memory element and configured to generate corresponding programmed redundancy address signals for the redundancy predecoder circuit to which it is coupled in response to having a redundancy address programmed therein; and
  a plurality of comparators coupled to a respective one of the plurality of redundancy address circuits and further coupled to a respective one of the driver circuits coupled to a respective redundant memory element, each comparator configured to generate an activation signal to cause the respective driver circuit to access the redundant memory element to which the respective driver circuit is coupled in response to receiving a memory address matching the programmed redundancy address signals.

56. The processor-based system of claim 55 wherein the plurality of decoder circuits coupled to the plurality of driver circuits that are coupled to the normal memory elements are a first plurality of decoders, and the redundancy system further comprises a second plurality of decoder circuits coupled to a respective one of the plurality of comparators and further coupled to a respective one of the drivers coupled to a respective one of the redundant memory elements, each decoder circuit of the second plurality configured to activate the respective driver circuit to access the redundant memory element to which the driver circuit is coupled in response to receiving an activation signal from the respective comparator.

57. A processor-based system, comprising:
  a data input device;
  a data output device;
  a processor coupled to the data input and output devices; and
  a memory device coupled to the processor, the memory device comprising,
    an address bus;
    a control bus;
    a data bus;
    an address decoder coupled to the address bus;
    a read/write circuit coupled to the data bus;
    a control circuit coupled to the control bus;
    a memory-cell array coupled to the address decoder, control circuit, and read/write circuit, the memory-cell array having a redundancy domain having a plurality of normal memory elements and at least one redundant memory element, the normal elements corresponding to a respective memory address and the redundant memory elements configured to have a memory address of the domain mapped thereto; and
    a redundancy system coupled to the address decoder and the memory-cell array, the redundancy receiving address signals and selecting a memory element in response to the address signals, the redundancy system comprising:
      a plurality of driver circuits, each driver circuit coupled to a respective one of the normal memory elements or a respective redundant memory element;
      a plurality of decoder circuits, each decoder circuit coupled to a respective one of the plurality of driver circuits that is coupled to a respective one of the normal memory elements and configured to activate the respective driver circuit to access the memory element to which the driver circuit is coupled, each decoder circuit further configured to be disabled in response to receiving an active redundancy decode signal;
      an address predecoder coupled to the decoder circuits, the address predecoder configured to generate predecode signals in response to receiving an input memory address to select the decoder circuit coupled to the driver circuit that is coupled to the normal memory element corresponding to the input memory address;

a plurality of redundancy decoders coupled to the plurality of decoder circuits, each decoder circuit coupled to a number of redundancy decoders, the number equal to the number of redundant memory elements of the domain, each redundancy decoder configured to generate an active redundancy decode signal to disable the respective decoder circuit in response to receiving redundancy predecode signals selecting the particular redundancy decoder;

a plurality of redundancy predecoder circuits coupled to the plurality of redundancy decoders, each redundancy predecoder circuit coupled to one of the redundancy decoders coupled to each decoder circuit and configured to generate redundancy predecode signals in response to receiving programmed redundancy address signals to select a redundancy decoder to which it is coupled to generate an active redundancy decode signal and disable the decoder circuit coupled to the normal element corresponding to the programmed redundancy address signals;

a plurality of redundancy address circuits coupled to a respective one of the plurality of redundancy predecoder circuits, each redundancy address circuit having programmable elements for programming a redundancy address corresponding to a defective normal memory element and configured to generate corresponding programmed redundancy address signals for the redundancy predecoder circuit to which it is coupled in response to having a redundancy address programmed therein; and a plurality of comparators coupled to a respective one of the plurality of redundancy address circuits and further coupled to a respective one of the driver circuits coupled to a respective redundant memory element, each comparator configured to generate an activation signal to cause the respective driver circuit to access the redundant memory element to which the respective driver circuit is coupled in response to receiving a memory address matching the programmed redundancy address signals.

58. The processor-based system of claim 57 wherein the plurality of decoder circuits coupled to the plurality of driver circuits that are coupled to the normal memory elements are a first plurality of decoders, and the redundancy system further comprises a second plurality of decoder circuits coupled to a respective one of the plurality of comparators and further coupled to a respective one of the drivers coupled to a respective one of the redundant memory elements, each decoder circuit of the second plurality configured to activate the respective driver circuit to access the redundant memory element to which the driver circuit is coupled in response to receiving an activation signal from the respective comparator.

59. A processor-based system, comprising:
a data input device;
a data output device;
a processor coupled to the data input and output devices; and a memory device coupled to the processor, the memory device comprising,
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit, the memory-cell array having a redundancy domain having a plurality of normal memory elements and at least one redundant memory element, the normal elements corresponding to a respective memory address and the redundant memory elements configured to have a memory address of the domain mapped thereto; and
a redundancy system coupled to the address decoder and the memory-cell array, the redundancy receiving address signals and selecting a memory element in response to the address signals, the redundancy system comprising:
a plurality of driver circuits, each driver circuit coupled to a respective one of the normal memory elements or a respective redundant memory element, each driver circuit coupled to a respective one of the normal memory elements configured to drive the memory element to which it is coupled in response to being activated and further configured to be disabled in response to receiving an active redundancy decode signal;

a plurality of decoder circuits, each decoder circuit coupled to a respective one of the plurality of driver circuits that is coupled to a respective one of the normal memory elements and configured to activate the respective driver circuit to access the memory element to which the driver circuit is coupled;

an address predecoder coupled to the decoder circuits, the address predecoder configured to generate predecode signals in response to receiving an input memory address to select the decoder circuit coupled to the driver circuit that is coupled to the normal memory element corresponding to the input memory address;

a plurality of redundancy decoders coupled to the plurality of driver circuits, each driver circuit coupled to a number of redundancy decoders, the number equal to the number of redundant memory elements of the domain, each redundancy decoder configured to generate an active redundancy decode signal to disable the respective driver circuit in response to receiving redundancy predecode signals selecting the particular redundancy decoder;

a plurality of redundancy predecoder circuits coupled to the plurality of redundancy decoders, each redundancy predecoder circuit coupled to one of the redundancy decoders coupled to each disable circuit and configured to generate redundancy predecode signals in response to receiving programmed redundancy address signals to select a redundancy decoder to which it is coupled to generate an active redundancy decode signal and disable the driver circuit coupled to the normal element corresponding to the programmed redundancy address signals;

a plurality of redundancy address circuits coupled to a respective one of the plurality of redundancy predecoder circuits, each redundancy address circuit having programmable elements for programming a redundancy address corresponding to a defective normal memory element and configured to generate corresponding programmed redundancy address signals for the redundancy predecoder circuit to which it is coupled in response to having a redundancy address programmed therein; and a plurality of comparators coupled to a respective one of the plurality of redundancy address circuits and further coupled to a respective one of the driver circuits coupled to a respective redundant memory element, each comparator configured to generate an activation signal to cause the respective driver circuit to access the redundant memory element to which the respective driver circuit is coupled in response to receiving a memory address matching the programmed redundancy address signals.

60. The processor-based system of claim 59 wherein the plurality of decoder circuits coupled to the plurality of driver circuits that are coupled to the normal memory elements are a first plurality of decoders, and the redundancy system further comprises a second plurality of decoder circuits coupled to a respective one of the plurality of comparators and further coupled to a respective one of the drivers coupled to a respective one of the redundant memory elements, each decoder circuit of the second plurality configured to activate the respective driver circuit to access the redundant memory element to which the driver circuit is coupled in response to receiving an activation signal from the respective comparator.

61. A method for accessing a memory element in response to receiving a memory address, the method comprising:
  receiving redundant address signals representative of programmed redundant addresses, the programmed redundant addresses corresponding to normal memory elements that are defective, each programmed redundant address associated with a respective redundant memory element;
  based on the redundant address signals, disabling access to the normal memory elements corresponding to the programmed redundant addresses;
  after access to the normal elements corresponding to the programmed redundant address has been disabled, comparing the memory address with the programmed redundant addresses;
  in response to determining the memory address matches one of the programmed redundant addresses, accessing the redundant memory element associated with the programmed redundant address matching the memory address; and
  otherwise accessing the normal memory element corresponding to the memory address.

62. The method of claim 61 wherein each of the normal memory elements is coupled to a corresponding decoder circuit and driver circuit, and disabling access to the normal memory elements corresponding to the programmed redundant addresses comprises disabling the decoder circuits corresponding to the programmed redundant addresses from responding to the memory addresses for the normal elements to which the decoder circuits are coupled.

63. The method of claim 61 wherein each of the normal memory elements is coupled to a corresponding decoder circuit and driver circuit, and disabling access to the normal memory elements corresponding to the programmed redundant addresses comprises disabling the driver circuit from driving the respective normal memory element corresponding to the programmed redundant addresses when selected by the respective decoder circuit.

64. The method of claim 61 wherein disabling access to the normal memory elements corresponding to the programmed redundant addresses based on the redundant address signals comprises disabling access to only the normal memory elements corresponding to the programmed redundant addresses based on the redundant address signals.

65. The method of claim 61, further comprising in response to determining the memory address matches one of the programmed redundant addresses, waiting a delay before accessing the redundant memory element associated with the programmed redundant address matching the memory address, the delay approximately equal to a signal propagation delay for a decoder circuit coupled to a respective normal memory element.

66. A method for remapping memory addresses corresponding to normal memory elements to a respective redundant memory element, the method comprising:
  programming redundant addresses corresponding to the normal memory elements;
  for each programmed redundant address, generating redundancy predecode signals to activate a respective redundancy decoder that disables access to the respective normal element corresponding to the programmed redundant address;
  comparing memory addresses with the programmed redundant addresses; and
  accessing the redundant memory elements associated with the programmed redundant address in response to a memory address matching a programmed redundant address.

67. The method of claim 66 wherein each of the normal memory elements is coupled to a corresponding decoder circuit and driver circuit, and the method further comprises disabling the decoder circuits corresponding to the programmed redundant addresses from responding to the memory addresses for the normal elements to which the decoder circuits are coupled in response to activating a redundancy decoder coupled to the decoder circuit.

68. The method of claim 66 wherein each of the normal memory elements is coupled to a corresponding decoder circuit and driver circuit, and the method further comprises disabling the driver circuits corresponding to the programmed redundant addresses from responding to the memory addresses for the normal elements to which the driver circuits are coupled in response to activating a redundancy decoder coupled to the driver circuit.

69. The method of claim 66, further comprising waiting a delay before accessing the redundant memory element associated with the programmed redundant address matching the memory address, the delay approximately equal to a signal propagation delay for a decoder circuit coupled to a respective normal memory element.

* * * * *